United States Patent
Ogasawara et al.

(10) Patent No.: US 9,941,112 B2
(45) Date of Patent: Apr. 10, 2018

(54) METHOD OF MANUFACTURING SEMICONDUCTOR DEVICE AND SEMICONDUCTOR DEVICE

(71) Applicant: SHINDENGEN ELECTRIC MANUFACTURING CO., LTD., Tokyo (JP)

(72) Inventors: Atsushi Ogasawara, Saitama (JP); Koji Ito, Hanno (JP); Kazuhiko Ito, Hanno (JP); Koya Muyari, Hanno (JP)

(73) Assignee: SHINDENGEN ELECTRIC MANUFACTURING CO., LTD, Tokyo (JP)

( * ) Notice: Subject to any disclaimer, the term of this patent is extended or adjusted under 35 U.S.C. 154(b) by 398 days.

(21) Appl. No.: 13/980,435

(22) PCT Filed: Nov. 28, 2012

(86) PCT No.: PCT/JP2012/080795
§ 371 (c)(1),
(2) Date: Jul. 18, 2013

(87) PCT Pub. No.: WO2013/168314
PCT Pub. Date: Nov. 14, 2013

(65) Prior Publication Data
US 2014/0312472 A1 Oct. 23, 2014

(30) Foreign Application Priority Data

May 8, 2012 (WO) .................. PCT/JP2012/061779
May 8, 2012 (WO) .................. PCT/JP2012/061780

(51) Int. Cl.
*H01L 21/02* (2006.01)
*C03C 3/066* (2006.01)
(Continued)

(52) U.S. Cl.
CPC ............ *H01L 21/022* (2013.01); *C03C 3/066* (2013.01); *C03C 3/093* (2013.01); *C03C 8/04* (2013.01);
(Continued)

(58) Field of Classification Search
CPC ............ H01L 29/8611; H01L 29/8613; H01L 23/291; H01L 23/3178
See application file for complete search history.

(56) References Cited

U.S. PATENT DOCUMENTS 4,217,689 A 8/1980 Fujii et al.
5,047,369 A 9/1991 Fleming et al.
(Continued)

FOREIGN PATENT DOCUMENTS

CN 1653009 A 8/2005
CN 101250026 A 8/2008
(Continued)

OTHER PUBLICATIONS

Extended European Search Report dated Oct. 16, 2015, corresponding to European Patent Application No. 12837604.3.
(Continued)

*Primary Examiner* — Marcos D Pizarro Crespo
(74) *Attorney, Agent, or Firm* — Hauptman Ham, LLP

(57) ABSTRACT

Provided is a method of manufacturing a semiconductor device which includes, in the following order: a first step of preparing a semiconductor element which includes a pn junction exposure portion; a second step of forming an insulation layer such that the insulation layer covers the pn junction exposure portion; and a third step of forming a glass layer on the insulation layer where a layer made of glass composition for protecting a semiconductor junction is
(Continued)

formed on the insulation layer and, thereafter, the layer made of glass composition for protecting a semiconductor junction is baked.

21 Claims, 11 Drawing Sheets

(51) Int. Cl.

| | | |
|---|---|---|
| *C03C 3/093* | (2006.01) | |
| *C03C 8/04* | (2006.01) | |
| *C03C 8/24* | (2006.01) | |
| *H01L 29/861* | (2006.01) | |
| *H01L 29/06* | (2006.01) | |
| *H01L 23/29* | (2006.01) | |
| *H01L 23/31* | (2006.01) | |
| *H01L 21/762* | (2006.01) | |
| *H01L 23/00* | (2006.01) | |

(52) U.S. Cl.
CPC .......... *C03C 8/24* (2013.01); *H01L 21/02123* (2013.01); *H01L 21/02172* (2013.01); *H01L 21/02318* (2013.01); *H01L 21/76232* (2013.01); *H01L 23/291* (2013.01); *H01L 23/3178* (2013.01); *H01L 23/564* (2013.01); *H01L 29/0661* (2013.01); *H01L 29/8611* (2013.01); *H01L 29/8613* (2013.01); *H01L 2924/0002* (2013.01)

(56) References Cited

U.S. PATENT DOCUMENTS

| | | | | |
|---|---|---|---|---|
| 5,298,330 | A * | 3/1994 | Stadnicar, Jr. | .......... C03C 3/064 |
| | | | | 428/432 |
| 5,652,176 | A * | 7/1997 | Maniar | .................... H01L 21/28 |
| | | | | 257/E21.158 |
| 5,733,383 | A * | 3/1998 | Fazan | ................ H01L 21/76232 |
| | | | | 148/33.3 |
| 5,998,037 | A * | 12/1999 | Sridharan, Sr. | ......... C03C 3/064 |
| | | | | 427/126.4 |
| 6,171,987 | B1 | 1/2001 | Hormadaly | |
| 9,318,401 | B2 | 4/2016 | Muyari et al. | |
| 9,455,231 | B2 | 9/2016 | Ogasawara et al. | |
| 2002/0023674 | A1 | 2/2002 | Sugawara et al. | |
| 2004/0018931 | A1 | 1/2004 | Sridharan et al. | |
| 2006/0175083 | A1 | 8/2006 | Muramatsu et al. | |
| 2006/0181828 | A1 | 8/2006 | Sato et al. | |
| 2008/0161178 | A1 | 7/2008 | Besinger et al. | |
| 2008/0223607 | A1 | 9/2008 | Muramatsu et al. | |
| 2009/0109654 | A1 | 4/2009 | Fechner et al. | |
| 2010/0129726 | A1 | 5/2010 | Tanida et al. | |
| 2011/0053753 | A1 | 3/2011 | Mayumi et al. | |
| 2013/0105797 | A1 | 5/2013 | Hayashi et al. | |
| 2014/0339685 | A1 | 11/2014 | Muyari et al. | |
| 2014/0352778 | A1 * | 12/2014 | Yang | ............... H01L 31/022425 |
| | | | | 136/256 |

FOREIGN PATENT DOCUMENTS

| | | | |
|---|---|---|---|
| CN | 101801873 A | | 8/2010 |
| CN | 103403846 A | | 11/2013 |
| GB | 1180908 A | | 2/1970 |
| JP | 52040071 A | * | 3/1977 |
| JP | 53-36463 A | | 4/1978 |
| JP | 53093783 A | | 8/1978 |
| JP | 5526656 A | | 2/1980 |
| JP | 57202742 A | | 12/1982 |
| JP | 0186629 A | | 7/1989 |
| JP | 2-163938 A | | 6/1990 |
| JP | 10-116828 A | | 5/1998 |
| JP | 10116828 A | * | 5/1998 |
| JP | 10-294473 A | | 11/1998 |
| JP | 2001287984 A | * | 10/2001 |
| JP | 2002-16272 A | | 1/2002 |
| JP | 2004087955 A | * | 3/2004 |
| JP | 2005525287 A | | 8/2005 |
| JP | 2005298259 A | | 10/2005 |
| JP | 2006-253669 A | | 9/2006 |
| JP | 2011-60857 A | | 3/2011 |
| WO | 03/097546 A1 | | 11/2003 |

OTHER PUBLICATIONS

International Search Report issued in PCT/JP2012/080795, dated Feb. 26, 2013.
International Search Report issued in PCT/JP2012/080795, dated Feb. 26, 2013.
Extended European Search Report dated Oct. 21, 2015, corresponding to European Patent Application No. 12876275.4.
Fluegel, Alexander., "Thermal Expansion Calculation for Silicate Glasses at 210 C Based on a Systematic Analysis of Global Databases." Glass Technology, V. 51, No. 5 (Oct. 2010), pp. 191-201, ill. 1753-3346.
International Search Report dated Aug. 21, 2012, corresponding to PCT/JP2012/061777.
Office Action in U.S. Appl. No. 15/063,420, dated Dec. 15, 2016.

* cited by examiner

| item | | example 1 | example 2 | example 3 | example 4 | example 5 | example 6 | example 7 | example 8 | example 9 | example 10 | example 11 | comparison example 1 | comparison example 2 | comparison example 3 | comparison example 4 | comparison example 5 | comparison example 6 |
|---|---|---|---|---|---|---|---|---|---|---|---|---|---|---|---|---|---|---|
| composition ratio (mol ratio) | $SiO_2$ | 49.6 | 48.3 | 55.3 | 61.2 | 52.5 | 57.2 | 58.3 | 58.3 | 58.3 | 58.9 | 55.3 | 75.0 | 12.0 | 57.2 | 55.4 | 49.6 | 76.0 |
| | $Al_2O_3$ | 12.4 | 11.1 | 13.8 | 14.0 | 14.0 | 14.1 | 12.0 | 14.0 | 14.0 | 8.8 | 4.5 | 5.0 | 0 | 14.1 | 13.7 | 12.4 | 1.5 |
| | $B_2O_3$ | 12.1 | 6.9 | 13.5 | 8.8 | 17.5 | 13.9 | 11.7 | 11.7 | 11.7 | 13.7 | 13.8 | 0 | 29.0 | 13.9 | 13.6 | 12.1 | 19.0 |
| | ZnO | 14.3 | 22.7 | 4.5 | 8.0 | 8.0 | 4.6 | 9.0 | 8.0 | 8.0 | 7.8 | 13.5 | 0 | 58.0 | 4.6 | 4.4 | 14.3 | 0 |
| alkaline earth metal | CaO | 5.5 | 5.0 | 7.3 | 2.4 | 2.4 | 6.1 | 2.7 | 2.4 | 4.0 | 4.9 | 7.3 | 0 | 0 | 6.1 | 6.0 | 5.5 | 0.6 |
| | MgO | 2.2 | 2.0 | 0 | 0 | 2.2 | 0 | 1.3 | 1.1 | 0 | 2.0 | 0 | 0 | 0 | 0 | 0 | 2.2 | 0 |
| | BaO | 3.3 | 3.0 | 5.0 | 5.6 | 3.4 | 4.1 | 5.0 | 4.5 | 4.0 | 2.9 | 5.0 | 0 | 0 | 4.1 | 3.9 | 3.3 | 0 |
| | NiO | 0.6 | 1.0 | 0.6 | 0 | 0 | 0 | 0 | 0 | 0 | 1.0 | 0.6 | 0 | 0 | 0 | 3.0 | 0.6 | 0 |
| | $ZrO_2$ | 0 | 0 | 0 | 0 | 0 | 0 | 0 | 0 | 0 | 0 | 0 | 0 | 0 | 0 | 0 | 0 | 0.9 |
| | PbO | 0 | 0 | 0 | 0 | 0 | 0 | 0 | 0 | 0 | 0 | 0 | 20.0 | 0 | 0 | 0 | 0 | 0 |
| | $Na_2O$ | 0 | 0 | 0 | 0 | 0 | 0 | 0 | 0 | 0 | 0 | 0 | 0 | 0 | 0 | 0 | 0 | 1.0 |
| | $K_2O$ | 0 | 0 | 0 | 0 | 0 | 0 | 0 | 0 | 0 | 0 | 0 | 0 | 0 | 0 | 0 | 0 | 1.0 |
| | other | 0 | 0 | 0 | 0 | 0 | 0 | 0 | 0 | 0 | 0 | 0 | 0 | 1.0 | 0 | 0 | 0 | 0 |
| | total | 100.0 | 100.0 | 100.0 | 100.0 | 100.0 | 100.0 | 100.0 | 100.0 | 100.0 | 100.0 | 100.0 | 100.0 | 100.0 | 100.0 | 100.0 | 100.0 | 100.0 |
| insulation layer | | present | present | present | present | present | present | present | present | present | present | present | not present | not present | not present | not present | not present | not present |
| filler | | not contained | not contained | not contained | not contained | not contained | not contained | not contained | not contained | not contained | not contained | not contained | not contained | not contained | not contained | not contained | not contained | not contained |
| evaluation aspect | evaluation aspect 1 (environmental load) | good | good | good | good | good | good | good | good | good | good | good | bad | good | good | good | good | good |
| | evaluation aspect 2 (baking temperature) | good | good | good | good | good | good | good | good | good | good | good | good | good | good | good | good | good |
| | evaluation aspect 3 (chemical resistance) | good | good | good | good | good | good | good | good | good | good | good | good | bad | good | good | good | good |
| | evaluation aspect 4 (average linear expansion coefficient) | good (4.1) | good (4.2) | good (4.0) | good (3.8) | good (3.8) | good (3.8) | good (3.7) | good (3.5) | good (3.4) | good (3.9) | good (4.0) | good (4.2) | good (4.2) | good (3.7) | good (3.1) | good (4.1) | good (2.5) |
| | evaluation aspect 5 (presence or non-presence of crystallization) | good | good | good | good | good | good | good | good | good | good | good | good | good | good | bad | good | good |
| | evaluation aspect 6 (presence or non-presence of generation of bubbles) | good | good | good | good | good | good | good | good | good | good | good | good | good | bad | good | good | good |
| | evaluation aspect 7 (content of NiO) | good | good | good | very good | very good | very good | very good | very good | very good | very good | good | very good | very good | very good | bad | good | good |
| | evaluation aspect 8 (reverse direction leak current) | good | good | good | good | good | good | good | good | good | good | good | bad | good | good | bad | bad | bad |
| | evaluation aspect 9 (high-temperature reverse bias resistance) | good | - | - | - | - | - | - | - | - | - | - | - | - | - | - | - | - |
| | evaluation aspect 10 (presence or non-presence of diffusion of B) | good | - | - | - | - | - | - | - | - | - | - | bad | bad | bad | - | - | bad |
| comprehensive evaluation | | good | good | good | good | good | good | good | good | good | good | good | bad | bad | bad | bad | bad | bad |

FIG.5

FIG.6A
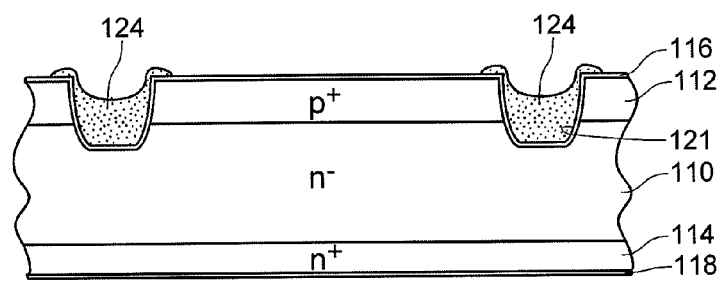
FIG.6B
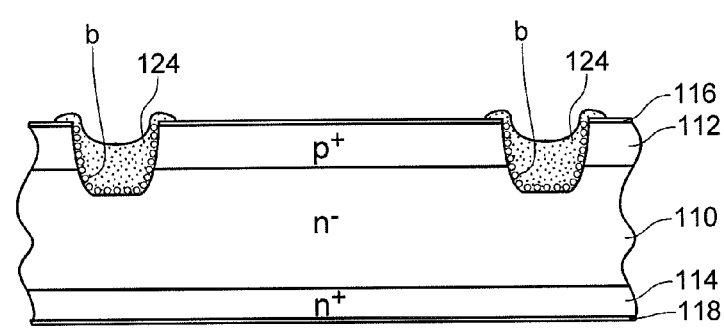
no insulation layer
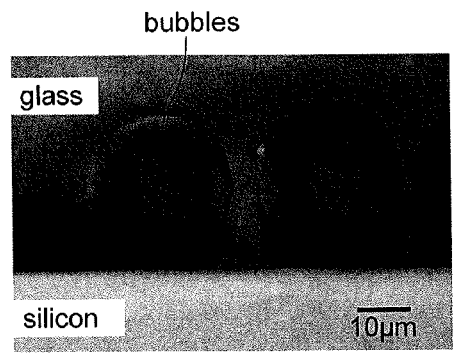
FIG.7A
with insulation layer
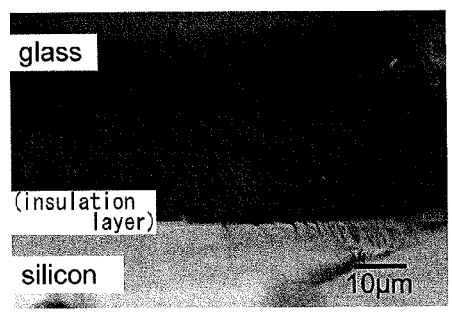
FIG.7B example 1 comparison example 5

METHOD OF MANUFACTURING SEMICONDUCTOR DEVICE AND SEMICONDUCTOR DEVICE

RELATED APPLICATIONS

The present application is a National Phase of PCT/JP2012/080795, filed Nov.28, 2012, and is based on, and claims priority from, PCT Application Nos. PCT/JP2012/061779 and PCT/JP2012/061780, filed May 8, 2012 respectively.

TECHNICAL FIELD

The present invention relates to a method of manufacturing a semiconductor device and a semiconductor device.

BACKGROUND ART

There has been known a method of manufacturing a semiconductor device where a glass layer for passivation is formed such that the glass layer covers a pn junction exposure portion in a process of manufacturing a mesa semiconductor device (see patent document 1, for example).

FIG. 12(a) to FIG. 12(d) and FIG. 13(a) to FIG. 13(d) are views for explaining such a conventional method of manufacturing a semiconductor device. FIG. 12(a) to FIG. 12(d) and FIG. 13(a) to FIG. 13(d) are views showing respective steps.

The conventional method of manufacturing a semiconductor device includes, as shown in FIG. 12 and FIG. 13, "semiconductor base body forming step", "trench forming step", "glass layer forming step", "photoresist forming step", "oxide film removing step", "roughened surface region forming step", "electrode forming step", and "semiconductor base body cutting step" in this order. Hereinafter, the conventional method of manufacturing a semiconductor device is explained in order of steps.

(a) Semiconductor Base Body Forming Step

Firstly, a $p^+$ type diffusion layer 912 is formed by diffusion of a p type impurity from one surface of an $n^-$ type semiconductor substrate ($n^-$ type silicon substrate) 910, and an $n^+$ type diffusion layer 914 is formed by diffusion of an n type impurity from the other surface of the $n^-$ type semiconductor substrate 910 thus forming a semiconductor base body in which a pn junction arranged parallel to a main surface of the semiconductor base body is formed. Thereafter, oxide films 916, 918 are formed by thermal oxidation on a surface of the $p^+$ type diffusion layer 912 and a surface of the $n^+$ type diffusion layer 914 respectively (see FIG. 12(a)).

(b) Trench Forming Step

Next, a predetermined opening portion is formed on the oxide film 916 at a predetermined position by photo etching. After etching the oxide film, subsequently, the semiconductor base body is etched thus forming a trench 920 having a depth exceeding the pn junction from one surface of the semiconductor base body (see FIG. 12(b)).

(c) Glass Layer Forming Step

Next, a layer made of glass composition for protecting a semiconductor junction is formed on an inner surface of the trench 920 and a surface of the semiconductor base body in the vicinity of the trench 920 by an electrophoresis method, and the layer made of glass composition for protecting a semiconductor junction is baked so that a glass layer 924 for passivation is formed on a surface of the trench 920 (see FIG. 12(c)).

(d) Photoresist Forming Step

Next, a photoresist 926 is formed such that the photoresist 926 covers a surface of the glass layer 924 (see FIG. 12(d)).

(e) Oxide Film Removing Step

Next, the oxide film 916 is etched using the photoresist 926 as a mask so that the oxide film 916 at a portion 930 where a Ni-plating electrode film is to be formed is removed (see FIG. 13(a)).

(f) Roughened Surface Region Forming Step

Next, a surface of the semiconductor base body at the portion 930 where a Ni-plating electrode film is to be formed is subjected to surface roughening treatment thus forming a roughened surface region 932 for enhancing adhesiveness between a Ni plating electrode and the semiconductor base body (see FIG. 13(b)).

(g) Electrode Forming Step

Next, a Ni plating is applied to the semiconductor base body thus forming an anode electrode 934 on the roughened surface region 932 and forming a cathode electrode 936 on the other surface of the semiconductor base body (see FIG. 13(c)). Annealing of the anode electrode 934 and the cathode electrode 936 is performed at a temperature of 600 degrees under a nitrogen atmosphere, for example.

(h) Semiconductor Base Body Cutting Step

Next, the semiconductor base body is cut by dicing or the like at a center portion of the glass layer 924 thus dividing the semiconductor base body into a plurality of chips whereby mesa semiconductor devices (pn diodes) are manufactured (see FIG. 13(d)).

As has been explained heretofore, the conventional method of manufacturing a semiconductor device includes the step of forming the trench 920 exceeding the pn junction on one surface of the semiconductor base body where the pn junction arranged parallel to the main surface is formed (see FIG. 12(a) and FIG. 12(b)), and the step of forming the glass layer 924 for passivation in the inside of the trench 920 such that the glass layer 924 covers a pn junction exposure portion (see FIG. 12(c)). Accordingly, in the conventional method of manufacturing a semiconductor device, by cutting the semiconductor base body after forming the glass layer 924 for passivation in the inside of the trench 920, mesa semiconductor devices having high breakdown strength (breakdown voltage) can be manufactured.

PRIOR ART DOCUMENT

Patent Document

[Patent Document 1] JP-A-2004-87955

SUMMARY OF THE INVENTION

Problems that the Invention is to Solve

A glass material which is used for forming a glass layer for passivation is required to satisfy all of the following conditions (a) to (d), that is, the condition (a) that the glass material can be baked at a proper temperature, the condition (b) that the glass material can withstand chemicals used in steps, the condition (c) that the glass material has a linear expansion coefficient close to a linear expansion coefficient silicon (particularly, an average linear expansion coefficient at a temperature of 50° C. to 550° C. being close to a linear expansion coefficient of silicon at a temperature of 50° C. to 550° C.) so as to prevent the warping of a wafer during steps, and the condition (d) that the glass material has excellent insulation property. In view of the above, conventionally, "a glass material containing lead silicate as a main component" has been widely used.

However, "the glass material containing lead silicate as a main component" contains lead which imposes a large load on an environment and hence, it is thought that the use of "the glass material containing lead silicate as a main component" will be prohibited near future.

In view of the above circumstances, the formation of a glass layer for passivation using a glass material containing no lead is considered. However, it is difficult for such a glass material containing no lead to satisfy all of the following conditions (a) to (d), that is, the condition (a) that the glass material can be baked at a proper temperature, the condition (b) that the glass material can withstand chemicals used in steps, the condition (c) that the glass material has a linear expansion coefficient close to a linear expansion coefficient of silicon (particularly, an average linear expansion coefficient at a temperature of 50° C. to 550° C. being close to a linear expansion coefficient of silicon at a temperature of 50° C. to 550° C.) so as to prevent the warping of a wafer during steps, and the condition (d) that the glass material has excellent insulation property. Accordingly, the realities are that the formation of a glass layer for passivation using a glass material containing no lead has not been yet applied to amass production process of power semiconductor devices.

Further, according to the studies carried out by the inventors of the present invention, it is found that in the case where a glass layer for passivation is formed using a glass material containing no lead, depending on the composition of the glass layer and the baking condition of the glass layer, there arises a drawback that bubbles are liable to be generated from a boundary surface between a semiconductor base body and the glass layer in step of forming the glass layer by baking the layer made of glass composition. To overcome such a drawback, it is necessary to add a component having a defoaming action (for example, nickel oxide, zirconium oxide or the like) the glass composition. However, there may be a case where such a component can not be added to the glass composition depending on the combination of components in the glass composition. Accordingly, the addition of the component having a defoaming action is not desirable.

Further, according to the studies carried out by the inventors of the present invention, it is found that in the case where a glass layer for passivation is formed using a glass material containing no lead, depending on the composition of the glass layer and the baking condition of the glass layer (composition of glass: composition containing a large amount of $SiO_2$, baking condition: performed for a short period of time), there arises a drawback that a reverse direction leak current is increased. That is, it is found that a reverse direction leak current is increased unless baking is performed for a long period of time (for example, three hours).

The present invention has been made under the above-mentioned circumstances, and it is an object of the present invention to provide a method of manufacturing a semiconductor device which can manufacture a semiconductor device having high breakdown strength using a glass material containing no lead in the same manner as a conventional case where "a glass material containing lead silicate as a main component" is used, and such a semiconductor device.

It is another object of the present invention to provide a method of manufacturing a semiconductor device where it is possible to suppress the generation of bubbles which may be generated from a boundary surface between a semiconductor base body and a glass layer in step of forming the glass layer by baking a layer made of glass composition regardless of the composition of the glass layer and the baking condition of the glass layer without adding a component having a defoaming action such as nickel oxide or with the addition of a small amount (for example, 2.0 mol % or less) of such a component having a defoaming action even when the component is added, and such a semiconductor device.

It is still another object of the present invention to provide a method of manufacturing a semiconductor device which can manufacture a semiconductor device having a low reverse direction leak current in a stable manner regardless of the composition of a glass layer and the baking condition of the glass layer, and such a semiconductor device.

Means for Solving the Task

[1] The present invention is directed to a method of manufacturing a semiconductor device including, in the following order: a first step of preparing a semiconductor element which includes a pn junction exposure portion where a pn junction is exposed; a second step of forming an insulation layer such that the insulation layer covers the pn junction exposure portion; and a third step of forming a glass layer on the insulation layer where a layer made of glass composition for protecting a semiconductor junction is formed on the insulation layer and, thereafter, the layer made of glass composition for protecting a semiconductor junction is baked, wherein the glass composition for protecting a semiconductor junction is a glass composition for protecting a semiconductor junction which is made of fine glass particles prepared from a material in a molten state which is obtained by melting a raw material which contains at least $SiO_2$, $Al_2O_3$, $B_2O_3$, ZnO, and at least two oxides of alkaline earth metals selected from a group consisting of CaO, MgO and BaO, and substantially contains none of Pb, As, Sb, Li, Na and K, and the glass composition for protecting a semiconductor junction contains none of components which constitute the raw material in the form of a filler.

[2] In the method of manufacturing a semiconductor device according to the present invention, it is preferable that, in the glass composition for protecting a semiconductor junction, the content of $SiO_2$ falls within a range from 41.1 mol % to 61.1 mol %, the content of $Al_2O_3$ falls within a range from 7.4 mol % to 17.4 mol %, the content of $B_2O_3$ falls within a range from 5.8 mol % to 15.8 mol %, the content of ZnO falls within a range from 3.0 mol % to 24.8 mol %, and the content of oxide of an alkaline earth metal falls within a range from 5.5 mol % to 15.5 mol %.

[3] In the method of manufacturing a semiconductor device according to the present invention, it is preferable that, in the glass composition for protecting a semiconductor junction, the content of $SiO_2$ falls within a range from 49.5 mol % to 64.3 mol %, the content of $B_2O_3$ falls within a range from 8.4 mol % to 17.9 mol %, the content of $Al_2O_3$ falls within a range from 3.7 mol % to 14.8 mol %, the content of ZnO falls within a range from 3.9 mol % to 14.2 mol %, and the content of oxide of an alkaline earth metal falls within a range from 7.4 mol % to 12.9 mol %.

[4] In the method of manufacturing a semiconductor device according to the present invention, it is preferable that the glass composition for protecting a semiconductor junction substantially contains no multivalent element as a defoaming agent.

[5] In the method of manufacturing a semiconductor device according to the present invention, it is preferable that none of V, Mn, Sn, Ce, Nb and Ta is contained in the glass composition for protecting a semiconductor junction as the multivalent.

[6] In the method of manufacturing a semiconductor device according to the present invention, it is preferable that the raw material substantially contains no P.

[7] In the method of manufacturing a semiconductor device according to the present invention, it is preferable that the raw material substantially contains no Bi.

[8] In the method of manufacturing a semiconductor device according to the present invention, it is preferable that the glass composition for protecting a semiconductor junction substantially contains no organic binder.

[9] In the method of manufacturing a semiconductor device according to the present invention, it is preferable that the layer made of glass composition for protecting a semiconductor junction is baked at a temperature of 900° C. or below in the third step.

[10] In the method of manufacturing a semiconductor device according to the present invention, it is preferable that the insulation layer is made of silicon oxide.

[11] In the method of manufacturing a semiconductor device according to the present invention, it is preferable that the insulation layer is formed with a thickness which falls within a range from 5 nm to 100 nm in the second step.

[12] In the method of manufacturing a semiconductor device according to the present invention, it is preferable that the layer made of glass composition is formed by an electrophoresis method in the third step.

[13] In the method of manufacturing a semiconductor device according to the present invention, it is preferable that the insulation layer is formed with a thickness which falls within a range from 5 nm to 60 nm in the second step.

[14] In the method of manufacturing a semiconductor device according to the present invention, it is preferable that the first step comprises: a step of preparing a semiconductor base body having a pn junction arranged parallel to a main surface of the semiconductor base body; and a step of forming a trench having a depth which goes beyond the pn junction from one surface of the semiconductor base body thus forming the pn junction exposure portion on an inner surface of the trench, the second step includes a step of forming the insulation layer on the inner surface of the trench such that the insulation layer covers the pn junction exposure portion, and the third step includes a step of forming the glass layer on the insulation layer.

[15] In the method of manufacturing a semiconductor device according to the present invention, it is preferable that the insulation layer is formed by a thermal oxidation method in the second step.

[16] In the method of manufacturing a semiconductor device according to the present invention, it is preferable that the insulation layer is formed by a deposit method in the second step.

[17] In the method of manufacturing a semiconductor device according to the present invention, it is preferable that the first step includes a step of forming the pn junction exposure portion on a surface of a semiconductor base body, the second step includes a step of forming the insulation layer on the surface of the semiconductor base body such that the insulation layer covers the pn junction exposure portion, and the third step includes a step of forming the glass layer on the insulation layer.

[18] In the method of manufacturing a semiconductor device according to the present invention, it is preferable that the insulation layer is formed by a thermal oxidation method in the second step.

[19] In the method of manufacturing a semiconductor device according to the present invention, it is preferable that the insulation layer is formed by a deposit method in the second step.

[20] The present invention is also directed to a semiconductor device including: a semiconductor element which includes a pn junction exposure portion where a pn junction is exposed; an insulation layer which is formed such that the insulation layer covers the pn junction exposure portion; and a glass layer which is formed on the insulation layer, the glass layer being formed such that a layer made of glass composition for protecting a semiconductor junction is formed on the insulation layer and, thereafter, the layer made of glass composition for protecting a semiconductor junction is baked, wherein the glass composition for protecting a semiconductor junction is a glass composition for protecting a semiconductor junction which is made of fine glass particles prepared from a material in a molten state which is obtained by melting a raw material which contains at least $SiO_2$, $Al_2O_3$, $B_2O_3$, ZnO, and at least two oxides of alkaline earth metals selected from a group consisting of CaO, MgO and BaO, and substantially contains none of Pb, As, Sb, Li, Na and K, and the glass composition for protecting a semiconductor junction contains none of components which constitute the raw material in the form of a filler.

Advantage of the Invention

According to the method of manufacturing a semiconductor device and such a semiconductor device of the present invention, as can be clearly found from examples described later, it becomes possible to provide a semiconductor device having high breakdown strength using a glass material containing no lead in the same manner as a conventional case where "a glass material containing lead silicate as a main component" is used.

That is, the method of manufacturing a semiconductor device and such a semiconductor device of the present invention can satisfy all of the following conditions (a) to (d), that is, the condition (a) that the glass material can be baked at a proper temperature, the condition (b) that the glass material can withstand chemicals used in steps, the condition (c) that the glass material has a linear expansion coefficient close to a linear expansion coefficient of silicon (particularly, an average linear expansion coefficient at a temperature of 50° C. to 550° C. being close to a linear expansion coefficient of silicon at a temperature of 50° C. to 550° C.) so as to prevent the warping of a wafer during steps, and the condition (d) that the glass material has excellent insulation property.

According to the method of manufacturing a semiconductor device and such a semiconductor device of the present invention, the insulation layer having higher wettability than the semiconductor base body is interposed between the semiconductor base body and the glass layer and hence, it is possible to make bubbles hardly generated from a boundary surface between the semiconductor base body and the glass layer in step of forming the glass layer by baking the layer made of glass composition. Accordingly, it is possible to suppress the generation of bubbles without adding a component having a defoaming action such as nickel oxide or with the addition of a small amount (for example, 2.0 mol % or less) of such a component having a defoaming action even when the component is added.

Further, according to the method of manufacturing a semiconductor device and such a semiconductor device of the present invention, the insulation layer is interposed between the semiconductor base body and the glass layer and hence, insulation property is enhanced whereby, as can be clearly found from the examples described later, it is possible to manufacture a semiconductor device having a low reverse direction leak current in a stable manner regardless of the composition of the glass layer and the baking condition of the glass layer. That is, even when the content of $SiO_2$ is 55 mol % or more or even when a baking time is set to approximately 15 minutes, it is possible to manufacture a semiconductor device having a low reverse direction leak current in a stable manner.

Further, according to the method of manufacturing a semiconductor device and such a semiconductor device of the present invention, a glass layer is formed by baking the layer made of glass composition for protecting a semiconductor junction which is made of fine glass particles prepared from a material in a molten state which is obtained by melting a raw material which contains at least $SiO_2$, $Al_2O_3$, $B_2O_3$, ZnO, and at least two oxides of alkaline earth metals selected from a group consisting of CaO, MgO and BaO, and substantially contains none of Pb, As, Sb, Li, Na and K. Accordingly, as can be also clearly found from the examples described later, baking of the glass layer can be performed at a relatively low temperature and hence, the crystallization of the glass layer hardly occurs in step of baking the glass layer. Also due to such a technical feature, it is possible to manufacture a semiconductor device having a low reverse direction leak current in a stable manner.

Further, according to the method of manufacturing a semiconductor device and such a semiconductor device of the present invention, the glass layer is formed by baking the layer made of glass composition for protecting a semiconductor junction which contains none of components which constitute the raw material in the form of a filler. Accordingly, the crystallization of the glass layer hardly occurs in step of baking the glass layer. Also due to such a technical feature, it is possible to manufacture a semiconductor device having a low reverse direction leak current in a stable manner.

Further, according to the method of manufacturing a semiconductor device and such a semiconductor device of the present invention, it is possible to manufacture a semiconductor device having a glass layer made of lead-free glass (glass containing no Pb) which has a lower dielectric constant than lead-containing glass. Accordingly, when a resin-sealed-type semiconductor device is formed by molding the semiconductor device of the present invention with a resin, there is no possibility that highly concentrated ion is induced on an interface between the mold resin and the glass layer and an interface between the glass layer and the semiconductor layer in the midst of carrying out a high temperature reverse bias test. As a result, the semiconductor device of the present invention can acquire an advantageous effect that resistance against a high temperature reverse bias is increased compared to the conventional resin-sealed-type semiconductor device which is formed by molding a semiconductor device obtained by using "a glass material containing lead silicate as a main component" with a resin.

Further, according to the method of manufacturing a semiconductor device and such a semiconductor device of the present invention, the glass composition which substantially contains none of Li, Na and K is used and hence, as can be clearly found from examples described later (evaluation aspect 10), even when the glass composition contains B (boron), there is no possibility that B (boron) is diffused into silicon from the glass layer during baking of the glass composition whereby a highly reliable semiconductor device can be manufactured.

In the method of manufacturing a semiconductor device and such a semiconductor device of the present invention, "contains at least specific components ($SiO_2$, $Al_2O_3$, $B_2O_3$ and the like)" means not only a case where only the specific components are contained but also a case where components which can be usually contained in the glass composition are further contained in addition to the specific components.

In the method of manufacturing a semiconductor device and such a semiconductor device of the present invention, "substantially contains none of specific elements (Pb, As, Sb and the like)" means "substantially contains none of specific elements as components" and does not exclude the glass composition where the above-mentioned specific elements are mixed into raw materials for the respective components which constitute glass as impurities.

Further, in the method of manufacturing a semiconductor device and such a semiconductor device of the present invention, "substantially contains none of specific elements (Pb, As, Sb and the like)" means "substantially contains none of oxides of the specific elements, nitrides of the specific elements and the like".

Further, in the method of manufacturing a semiconductor device and such a semiconductor device of the present invention, "contains none of components which constitute the raw material in the form of a filler" means that when the component is $SiO_2$, for example, the component $SiO_2$ is not contained in the form of an embedding material, a packing material, a filling material, an addition material or the like formed of fine $SiO_2$ particles.

BRIEF DESCRIPTION OF THE DRAWINGS

FIG. 5 is a Table showing conditions and results of examples.

FIG. 6(a) and FIG. 6(b) are views for explaining bubbles b generated in the inside of a glass layer 124 in a preliminary evaluation.

FIG. 7(a) and FIG. 7(b) are photographs for explaining bubbles b generated in the inside of the glass layer 124 in a subsequent evaluation.

MODE FOR CARRYING OUT THE INVENTION

Figure 1A:
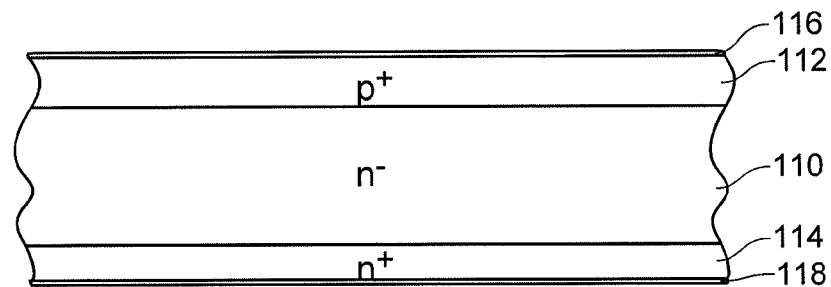
FIG. 1(a) to FIG. 1(d) are views for explaining a method of manufacturing a semiconductor device according to an embodiment 1.
Figure 1B:
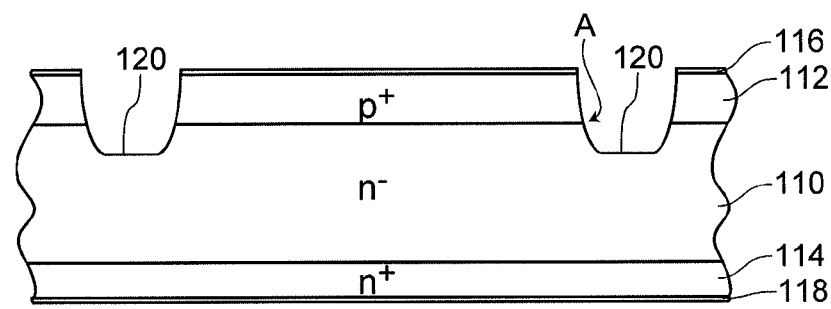

Hereinafter, a method of manufacturing a semiconductor device, and a semiconductor device according to the present invention are explained in conjunction with embodiments shown in the drawings.

[Embodiment 1]

The method of manufacturing a semiconductor device of the embodiment 1 is a method of manufacturing a semiconductor device which includes, in the following order: a first step of preparing a semiconductor element which includes a pn junction exposure portion where a pn junction is exposed; a second step of forming an insulation layer such that the insulation layer covers the pn junction exposure portion; and a third step of forming a glass layer on the insulation layer where a layer made of glass composition for protecting a semiconductor junction is formed on the insulation layer and, thereafter, the layer made of glass composition for protecting a semiconductor junction is baked. In the method of manufacturing a semiconductor device of the embodiment 1, mesa-type pn diodes are manufactured as semiconductor devices.

FIG. 1(a) to FIG. 1(d) and FIG. 2(a) to FIG. 2(d) are views for explaining a method of manufacturing a semiconductor device of the embodiment 1. FIG. 1(a) to FIG. 1(d) and FIG. 2(a) to FIG. 2(d) are views showing respective steps.

In the method of manufacturing a semiconductor device of the embodiment 1, as shown in FIG. 1(a) to FIG. 1(d) and FIG. 2(a) to FIG. 2(d), "semiconductor base body preparing step", "trench forming step", "insulation layer forming step", "glass layer forming step", "photoresist forming step", "oxide film removing step", "roughened surface region forming step", "electrode forming step", and "semiconductor base body cutting step" are carried out in this order. Hereinafter, the method of manufacturing the semiconductor device of the embodiment 1 is explained in order of steps.

(a) Semiconductor Base Body Preparing Step

Firstly, a $p^+$ type diffusion layer 112 is formed by diffusion of a p type impurity from one surface of an $n^-$ type semiconductor substrate (n type silicon substrate) 110, and an $n^+$ type diffusion layer 114 is formed by diffusion of an n type impurity from the other surface of the $n^-$ type semiconductor substrate 110 thus preparing a semiconductor base body in which a pn junction arranged parallel to a main surface of the semiconductor base body is formed. Thereafter, oxide films 116, 118 are formed by thermal oxidation on a surface of the $p^+$ type diffusion layer 112 and a surface of the $n^+$ type diffusion layer 114 respectively (see FIG. 1(a)).

(b) Trench Forming Step

Next, a predetermined opening portion is formed on the oxide film 116 at a predetermined position by a photo etching method. After etching the oxide film, subsequently, the semiconductor base body is etched thus forming a trench 120 having a depth exceeding the pn junction from one surface of the semiconductor base body (see FIG. 1(b)). Here, a pn junction exposure portion A is formed on an inner surface of the trench.

(c) Insulation Layer Forming Step

Figure 1C:
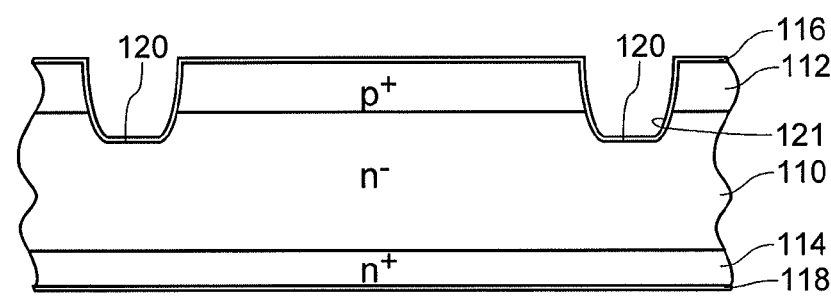

Next, an insulation layer 121 formed of a silicon oxide film is formed on an inner surface of the trench 120 by a thermal oxidation method using dry oxygen ($DryO_2$) (see FIG. 1(c)). A thickness of the insulation layer 121 is set to a value which falls within a range from 5 nm to 60 nm (for example, 20 nm). The insulation layer 121 is formed such that the semiconductor base body is introduced into a diffusion furnace and, thereafter, thermal oxidation treatment is performed at a temperature of 900° C. for 10 minutes while supplying an oxygen gas into the diffusion furnace. When the thickness of the insulation layer 121 is less than 5 nm, there exists a possibility that a reverse-direction current reduction effect cannot be acquired. On the other hand, when the thickness of the insulation layer 121 exceeds 60 nm, there exists a possibility that a layer made of glass composition cannot be formed by an electrophoresis method in the next glass layer forming step.

(d) Glass Layer Forming Step

Figure 1D:
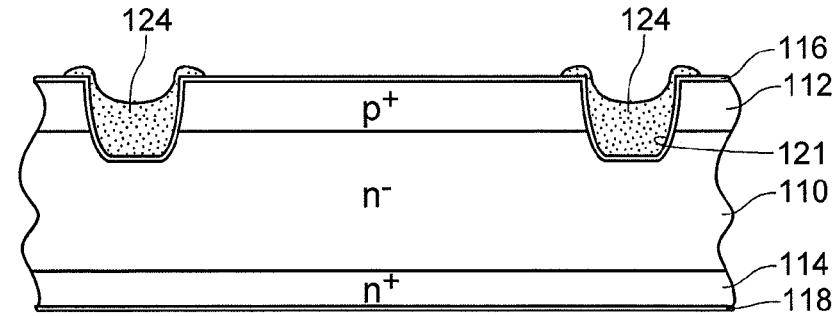

Next, a layer made of glass composition for protecting a semiconductor junction is formed on the inner surface of the trench 120 and a surface of the semiconductor base body in the vicinity of the trench 120 by an electrophoresis method, and the layer made of glass composition for protecting a semiconductor junction is baked so that a glass layer 124 for passivation is formed (see FIG. 1(d)). A baking temperature is set to 900° C., for example. Here, in forming the layer made of glass composition for protecting a semiconductor junction on the inner surface of the trench 120, the layer made of glass composition for protecting a semiconductor junction is formed so as to cover the inner surface of the trench 120 by way of the insulation layer 121. Accordingly, the pn junction exposure portion A in the trench 120 is covered with the glass layer 124 by way of the insulation layer 121.

As the glass composition for protecting a semiconductor junction, used is a glass composition for protecting a semiconductor junction which is made of fine glass particles prepared from a material in a molten state which is obtained by melting a raw material which contains at least $SiO_2$, $Al_2O_3$, $B_2O_3$, ZnO, and at least two oxides of alkaline earth metals selected from a group consisting of CaO, MgO and BaO, and substantially contains none of Pb, As, Sb, Li, Na and K, the glass composition for protecting a semiconductor junction containing none of components which constitute the raw material in the form of a filler.

As such glass composition for protecting a semiconductor junction, a glass composition is preferably used where the content of $SiO_2$ falls within a range from 41.1 mol % to 61.1 mol %, the content of $Al_2O_3$ falls within a range from 7.4 mol % to 17.4 mol %, the content of $B_2O_3$ falls within a range from 5.8 mol % to 15.8 mol %, the content of ZnO falls within a range from 3.0 mol % to 24.8 mol %, the content of oxide of an alkaline earth metal falls within a range from 5.5 mol % to 15.5 mol %, and the content of nickel oxide falls within a range from 0.01 mol % to 2.0 mol %. Further, a glass composition is preferably used where, with respect to oxide of an alkaline earth metal, the content of CaO falls within a range from 2.8 mol % to 7.8 mol %, the content of MgO falls within a range from 1.1 mol % to 3.1 mol %, and the content of BaO falls within a range from 1.7 mol % to 4.7 mol %.

As the glass composition for protecting a semiconductor junction, a glass composition which substantially contains no multivalent element (for example, V, Mn, Sn, Ce, Nb and Ta) as a defoaming agent is used. Further, as the glass composition for protecting a semiconductor junction, a glass composition which contains no organic binder is used.

As a raw material for the glass composition for protecting a semiconductor junction, it is preferable to use a raw material which substantially contains no P. Further, it is preferable to use a raw material which substantially contains no Bi.

In this case, "contains specific components ($SiO_2$, $Al_2O_3$, $B_2O_3$ and the like)" means not only a case where only the specific components are contained but also a case where components which can be usually contained in the glass composition are further contained in addition to the specific components. Further, "substantially contains none of specific elements (Pb, As, Sb and the like)" means "substantially contains none of specific elements as components" and does not exclude the glass composition where the above-mentioned specific elements are mixed into raw materials for the respective components which constitute glass as impurities. Further, "substantially contains none of specific elements (Pb, As, Sb and the like)" means "substantially contains none of oxides of specific elements, nitrides of specific elements and the like". Further, "contains none of components which constitute the raw material in the form of a filler" means that when the component is $SiO_2$, for example, the component $SiO_2$ is not contained in the form of an embedding material, a packing material, a filling material, an addition material or the like formed of fine $SiO_2$ particles.

The reason the content of the $SiO_2$ is set to a value which falls within a range from 41.1 mol % to 61.1 mol % is that when the content of $SiO_2$ is less than 41.1 mol %, there may be a case where the chemical resistance is deteriorated or the insulation property is degraded, while when the content of $SiO_2$ exceeds 61.1 mol %, there exists a tendency that a baking temperature needs to be elevated.

The reason the content of $Al_2O_3$ is set to a value which falls within a range from 7.4 mol % to 17.4 mol % is that when the content of $Al_2O_3$ is less than 7.4 mol %, there may be a case where the chemical resistance is deteriorated or the insulation property is degraded, while when the content of $Al_2O_3$ exceeds 17.4 mol %, there exists a tendency that a baking temperature needs to be elevated.

The reason the content of $B_2O_3$ is set to a value which falls within a range from 5.8 mol % to 15.8 mol % is that when the content of $B_2O_3$ is less than 5.8 mol %, there exists a tendency that a baking temperature needs to be elevated, while when the content of $B_2O_3$ exceeds 15.8 mol %, there may be a case where boron is diffused into the semiconductor base body in step of baking the glass layer thus degrading the insulation property.

The reason the content of ZnO is set to a value which falls within a range from 3.0 mol % to 24.8 mol % is that when the content of ZnO is less than 3.0 mol %, there exists a tendency that a baking temperature needs to be elevated, while when the content of ZnO exceeds 24.8 mol %, there may be a case where the chemical resistance is deteriorated or the insulation property is degraded.

The reason the content of oxide of alkaline earth metal is set to a value which falls within a range from 5.5 mol % to 15.5 mol % is that when the content of oxide of alkaline earth metal is less than 5.5 mol %, there exists a tendency that a baking temperature needs to be elevated, while when the content of oxide of alkaline earth metal exceeds 15.5 mol %, there may be a case where the chemical resistance is deteriorated or the insulation property is degraded.

Out of oxides of alkaline earth metals, the reason the content of CaO is set to a value which falls within a range from 2.8 mol % to 7.8 mol % is that when the content of CaO is less than 2.8 mol %, there exists a tendency that a baking temperature needs to be elevated, while when the content of CaO exceeds 7.8 mol %, there may be a case where the chemical resistance is deteriorated or the insulation property is degraded.

The reason the content of MgO is set to a value which falls within a range from 1.1 mol % to 3.1 mol % is that when the content of MgO is less than 1.1 mol %, there may be a case where the chemical resistance is deteriorated or the insulation property is degraded, while when the content of MgO exceeds 3.1 mol %, there exists a tendency that a baking temperature needs to be elevated.

The reason the content of BaO is set to a value which falls within a range from 1.7 mol % to 4.7 mol % is that when the content of BaO is less than 1.7 mol %, there exists a tendency that a baking temperature needs to be elevated, while when the content of BaO exceeds 4.7 mol %, there may be a case where the chemical resistance is deteriorated or the insulation property is degraded.

The reason the content of nickel oxide is set to a value which falls within a range from 0.01 mol % to 2.0 mol % is that when the content of nickel oxide is less than 0.01 mol %, there exists a case where it becomes difficult to suppress the generation of bubbles which may be generated from a boundary surface between a "layer made of glass composition for protecting a semiconductor junction" formed by an electrophoresis method and a semiconductor base body (silicon) in step of baking the layer made of glass composition for protecting a semiconductor junction, while when the content of nickel oxide exceeds 2.0 mol %, there may be a case where it becomes difficult to manufacture homogeneous glass.

The glass composition for protecting a semiconductor junction according to the embodiment 1 can be manufactured as follows. That is, raw materials ($SiO_2$, $Al(OH)_3$, $H_3BO_3$, ZnO, $CaCO_3$, $Mg(OH)_2$, BaO and NiO (nickel oxide)) are prepared at the above-mentioned composition ratio (molar ratio), these raw materials are sufficiently mixed by a mixer and, thereafter, the mixed raw material is put into a platinum crucible whose temperature is elevated to a predetermined temperature (1550° C., for example) in an electric furnace and is melted for a predetermined time. Then, the material in a molten state is made to flow out from the crucible and is fed to water-cooled rolls so that glass flakes in a flaky shape are obtained. Thereafter, the glass flakes are pulverized by a ball mill or the like until the glass flakes obtain a predetermined average particle size thus obtaining the powdery glass composition. The obtained powdery glass composition is directly used as the glass composition for protecting a semiconductor junction.

(e) Oxide Film Removing Step

Next, the photoresist 126 is formed so as to cover the surface of the glass layer 124 and, thereafter, the oxide film 116 is etched using the photoresist 126 as a mask so that the oxide film 116 at a portion 130 where a Ni-plating electrode film is to be formed is removed (see FIG. 2(*a*)).

(f) Roughened Surface Region Forming Step

Next, a surface of the semiconductor base body at the portion 130 where a Ni-plating electrode film is to be formed is subjected to surface roughening treatment thus forming a roughened surface region 132 for enhancing adhesiveness between a Ni plating electrode and the semiconductor base body (see FIG. 2(*b*)).

(g) Electrode Forming Step

Figure 2A:
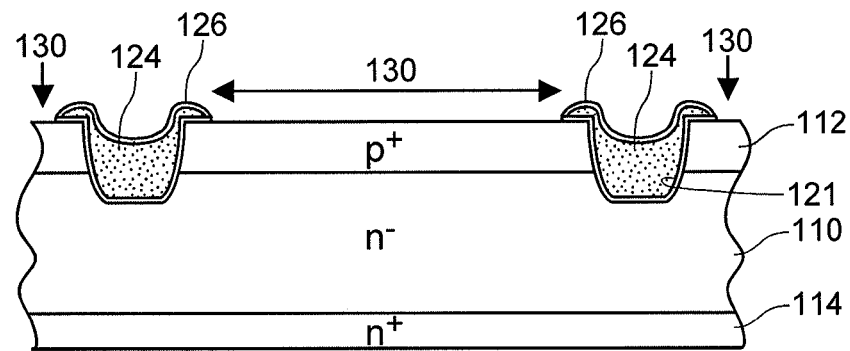
FIG. 2(a) to FIG. 2(d) are views for explaining the method of manufacturing the semiconductor device of the embodiment 1.
Figure 2B:
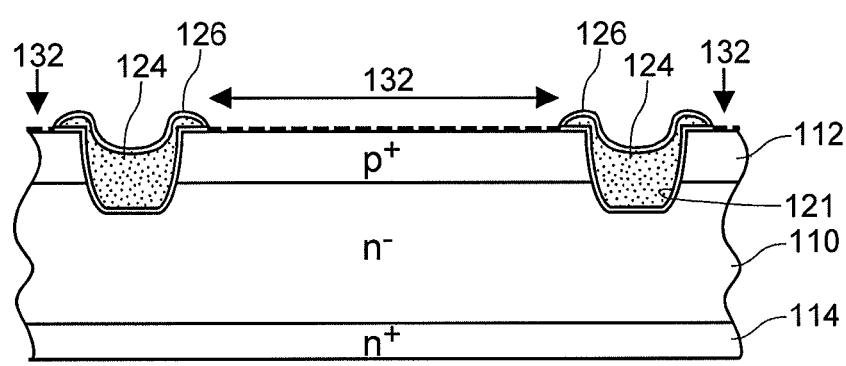
Figure 2C:
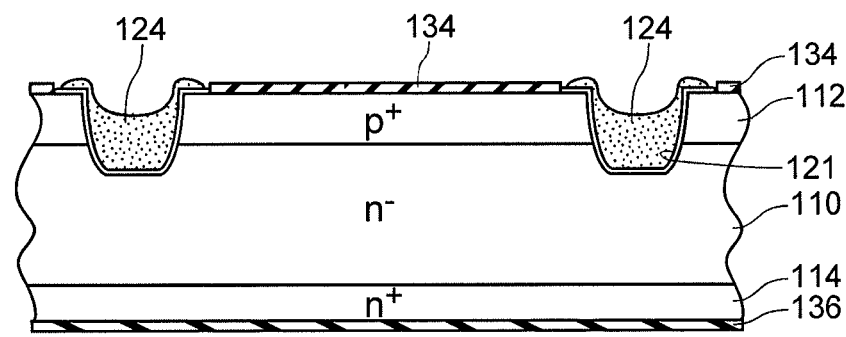

Next, a Ni plating is applied to the semiconductor base body thus forming an anode electrode 134 on the roughened surface region 132 and forming a cathode electrode 136 on the other surface of the semiconductor base body (see FIG. 2(c)). Annealing of the anode electrode 134 and the cathode electrode 136 is performed at a temperature of 600 degrees under a nitrogen atmosphere, for example.

(h) Semiconductor Base Body Cutting Step

Figure 2D:
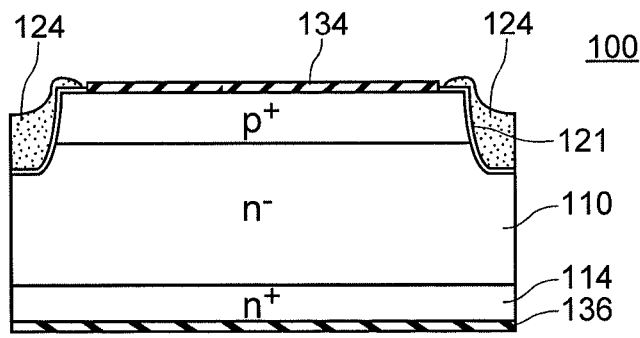

Next, the semiconductor base body is cut by dicing or the like at a center portion of the glass layer 124 thus dividing the semiconductor base body into chips whereby semiconductor devices (mesa-type pn diodes) 100 are manufactured (see FIG. 2(d)).

Through the above-mentioned steps, the semiconductor devices 100 according to the embodiment 1 can be manufactured.

According to the method of manufacturing a semiconductor device and such a semiconductor device of the embodiment 1, as can be clearly found from examples described later, it becomes possible to provide a semiconductor device having high breakdown strength using a glass material containing no lead in the same manner as a conventional case where "a glass material containing lead silicate as a main component" is used.

That is, the method of manufacturing a semiconductor device and such a semiconductor device of the embodiment 1 can satisfy all of the following conditions (a) to (d), that is, the condition (a) that the glass material can be baked at a proper temperature (900° or below, for example), the condition (b) that the glass material can withstand chemicals used in steps, the condition (c) that the glass material has a linear expansion coefficient close to a linear expansion coefficient of silicon (particularly, an average linear expansion coefficient at a temperature of 50° C. to 550° C. being close to a linear expansion coefficient of silicon at a temperature of 50° C. to 550° C.) so as to prevent the warping of a wafer during steps, and the condition (d) that the glass material has excellent insulation property. In this case, with the use of the glass composition for protecting a semiconductor junction which contains 55 mol % or more of $SiO_2$ and $B_2O_3$ in sum as the glass composition for protecting a semiconductor junction, chemical resistance of the glass composition can be enhanced.

According to the method of manufacturing a semiconductor device and such a semiconductor device of the embodiment 1, the insulation layer 121 having higher wettability than the semiconductor base body is interposed between the semiconductor base body and the glass layer 124 and hence, it is possible to make bubbles hardly generated from a boundary surface between the semiconductor base body and the glass layer 124 in step of forming the glass layer by baking the layer made of glass composition. Accordingly, it is possible to suppress the generation of bubbles without adding a component having a defoaming action such as nickel oxide or with the addition of a small amount (for example, 2.0 mol % or less) of such a component having a defoaming action even when the component is added.

Further, according to the method of manufacturing a semiconductor device and such a semiconductor device of the embodiment 1, the insulation layer 121 is interposed between the semiconductor base body and the glass layer 124 and hence, insulation property is enhanced whereby, as can be clearly found from the examples described later, it is possible to manufacture a semiconductor device having a low reverse direction leak current in a stable manner regardless of the composition of the glass layer and the baking condition of the glass layer. That is, even when the content of $SiO_2$ is 55 mol % or more or even when a baking time is set to approximately 15 minutes, it is possible to manufacture a semiconductor device having a low reverse direction leak current in a stable manner.

Further, according to the method of manufacturing a semiconductor device and such a semiconductor device of the embodiment 1, a glass layer is formed by baking the layer made of glass composition for protecting a semiconductor junction which is made of fine glass particles prepared from a material in a molten state which is obtained by melting a raw material which contains at least $SiO_2$, $Al_2O_3$, $B_2O_3$, ZnO, and at least two oxides of alkaline earth metals selected from a group consisting of CaO, MgO and BaO, and substantially contains none of Pb, As, Sb, Li, Na and K. Accordingly, as can be also clearly found from the examples described later, baking of the glass layer can be performed at a relatively low temperature and hence, the crystallization of the glass layer hardly occurs in step of baking the glass layer. Also due to such a technical feature, it is possible to manufacture a semiconductor device having a low reverse direction leak current in a stable manner.

Further, according to the method of manufacturing a semiconductor device and such a semiconductor device of the embodiment 1, the glass layer is formed by baking the layer made of glass composition for protecting a semiconductor junction which contains none of components which constitute the raw material in the form of a filler. Accordingly, the crystallization of the glass layer hardly occurs in step of baking the glass layer. Also due to such a technical feature, it is possible to manufacture a semiconductor device having a low reverse direction leak current in a stable manner.

Further, according to the method of manufacturing a semiconductor device and such a semiconductor device of the embodiment 1, it is possible to manufacture a semiconductor device having a glass layer made of lead-free glass (glass containing no Pb) which has a lower dielectric constant than lead-containing glass. Accordingly, when a resin-sealed-type semiconductor device is formed by molding the semiconductor device of the embodiment 1 with a resin, there is no possibility that highly concentrated ion is induced on an interface between the mold resin and the glass layer and an interface between the glass layer and the semiconductor layer in the midst of carrying out a high temperature reverse bias test. As a result, the semiconductor device of the present invention can acquire an advantageous effect that resistance against a high temperature reverse bias is increased compared to the conventional resin-sealed-type semiconductor device which is formed by molding a semiconductor device obtained by using "a glass material containing lead silicate as a main component" with a resin.

Further, according to the method of manufacturing a semiconductor device and such a semiconductor device of the embodiment 1, the glass composition which substantially contains none of Li, Na and K is used and hence, as can be also clearly found from examples described later (evaluation aspect 10), even when the glass composition contains B (boron), there is no possibility that B (boron) is diffused into silicon from the glass layer during baking of the glass composition whereby a highly reliable semiconductor device can be manufactured.

[Embodiment 2]

In the same manner as the method of manufacturing a semiconductor device of the embodiment 1, the method of manufacturing a semiconductor device of the embodiment 2 is a method of manufacturing a semiconductor device which includes, in the following order: a first step of preparing a silicon-made semiconductor element which includes a pn junction exposure portion where a pn junction is exposed; a second step of forming an insulation layer such that the insulation layer covers the pn junction exposure portion; and a third step of forming a glass layer on the insulation layer where a layer made of glass composition for protecting a semiconductor junction is formed on the insulation layer and, thereafter, the layer made of glass composition for protecting a semiconductor junction is baked. However, in the method of manufacturing a semiconductor device of the embodiment 2, a planar-type pn-diode is manufactured as a semiconductor device different from the method of manufacturing a semiconductor device of the embodiment 1.

FIG. 3(a) to FIG. 3(d) and FIG. 4(a) to FIG. 4(d) are views for explaining the method of manufacturing a semiconductor device of the embodiment 2. FIG. 3(a) to FIG. 3(d) and FIG. 4(a) to FIG. 4(d) are views showing respective steps.

In the method of manufacturing the semiconductor device of the embodiment 2, as shown in FIG. 3(a) to FIG. 3(d) and FIG. 4(a) to FIG. 4(d), "semiconductor base body preparing step", "$p^+$ type diffusion layer forming step", "$n^+$ type diffusion layer forming step", "insulation layer forming step", "glass layer forming step", "etching step" and "electrode forming step" are carried out in this order. Hereinafter, the method of manufacturing a semiconductor device of the embodiment 2 is explained in order of steps.

(a) Semiconductor Base Body Preparing Step

Figure 3A:
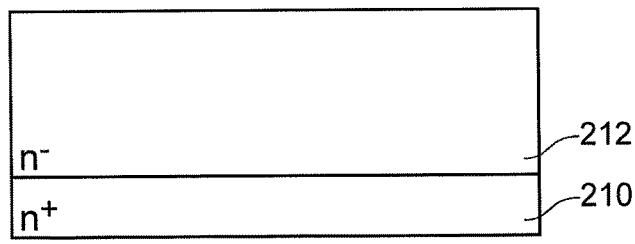
FIG. 3(a) to FIG. 3(d) are views for explaining a method of manufacturing a semiconductor device of an embodiment 2.
Figure 3B:
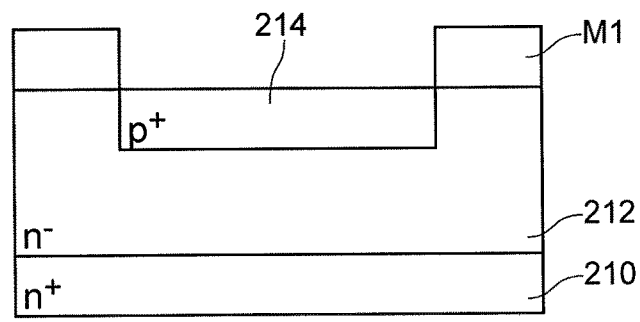
Figure 3C:
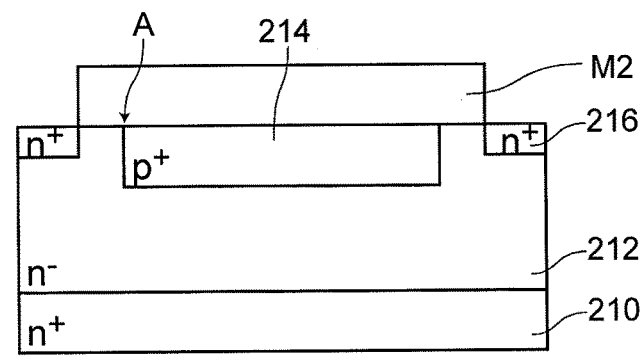

Firstly, a semiconductor base body where an $n^-$ type epitaxial layer 212 is laminated on an $n^+$ type semiconductor substrate 210 is prepared (see FIG. 3(a)).

(b) $p^+$ Type Diffusion Layer Forming Step

Next, after forming a mask M1 on the $n^-$ type epitaxial layer 212, a p type impurity (boron ion, for example) is implanted to a predetermined region on a surface of the $n^-$ type epitaxial layer 212 by an ion implantation method using the mask M1. Then, a $p^+$ type diffusion layer 214 is formed by thermal diffusion (see FIG. 3(b)).

(c) n' Type Diffusion Layer Forming Step

Next, the mask M1 is removed from the $n^-$ type epitaxial layer 212 and a mask M2 is formed on the $n^-$ type epitaxial layer 212. Thereafter, an n type impurity (arsenic ion, for example) is implanted to a predetermined region on the surface of the $n^-$ type epitaxial layer 212 by an ion implantation method using the mask M2. Then, an $n^+$ type diffusion layer 216 is formed by thermal diffusion (see FIG. 3(c)). Here, a pn junction exposure portion A is formed on a surface of the semiconductor base body.

(d) Insulation Layer Forming Step

Figure 3D:
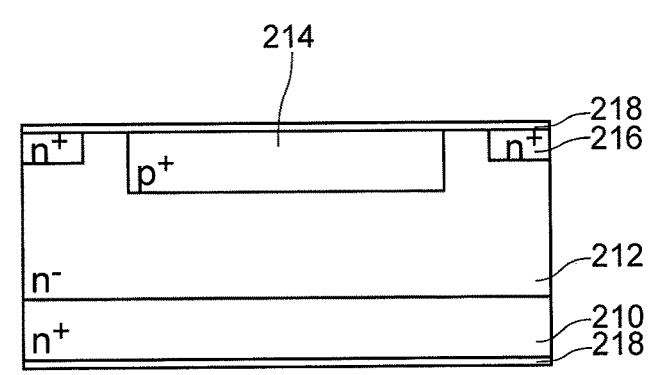

Next, the mask M2 is removed and, thereafter, an insulation layer 218 formed of a silicon oxide film is formed on a surface of the $n^-$ type epitaxial layer 212 (and a back surface of the $n^+$ type silicon substrate 210) by a thermal oxidation method using dry oxygen ($DryO_2$) (see FIG. 3(d)). A thickness of the insulation layer 218 is set to a value which falls within a range from 5 nm to 60 nm (for example, 20 nm). The insulation layer 218 is formed such that the semiconductor base body is introduced into a diffusion furnace and, thereafter, thermal oxidation treatment is performed at a temperature of 900° C. for 10 minutes by supplying an oxygen gas into the diffusion furnace. When the thickness of the insulation layer 218 is less than 5 nm, there exists a possibility that a reverse-direction current reduction effect cannot be acquired. On the other hand, when the thickness of the insulation layer 218 exceeds 60 nm, there exists a possibility that a layer made of glass composition cannot be formed by an electrophoresis method in the next glass layer forming step.

(e) Glass Layer Forming Step

Figure 4A:
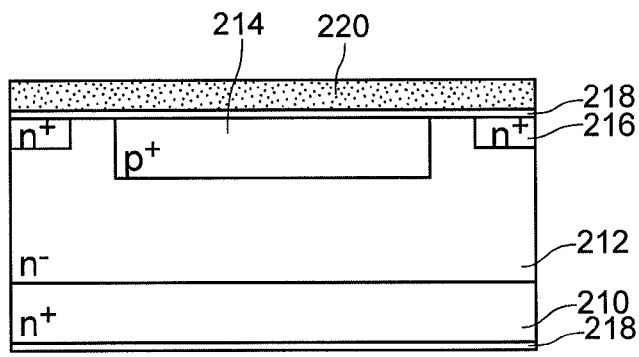
FIG. 4(a) to FIG. 4(d) are views for explaining the method of manufacturing the semiconductor device of the embodiment 2.

Next, a layer made of glass composition for protecting a semiconductor junction is formed on a surface of the insulation layer 218 by an electrophoresis method in the same manner as the embodiment 1 and, thereafter, the layer made of glass composition is baked so that a glass layer 220 for passivation is formed (see FIG. 4(a)). A baking temperature is set to 900° C., for example.

(f) Etching Step

Figure 4B:
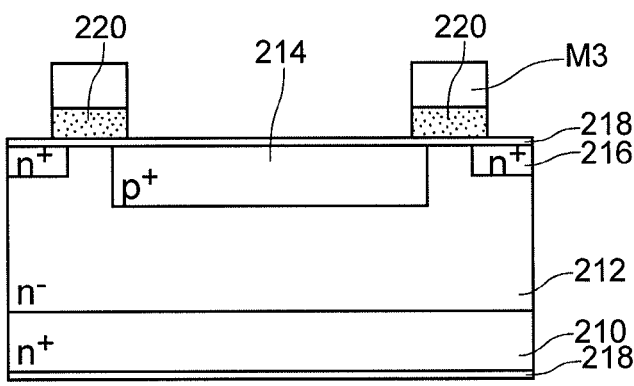
Figure 4C:
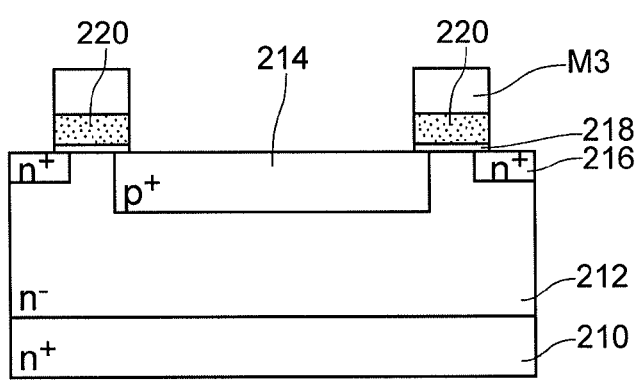

Next, a mask M3 is formed on a surface of the glass layer 220 and, thereafter, the glass layer 220 is etched (see FIG. 4(b)) and, subsequently, the insulation layer 218 is etched (see FIG. 4(c)). Due to such etching, the insulation layer 218 and the glass layer 220 are formed on a predetermined region on the surface of the $n^-$ type epitaxial layer 212.

(g) Electrode Forming Step

Next, the mask M3 is removed from the surface of the glass layer 220 and, thereafter, an anode electrode 222 is formed on a region on the surface of the semiconductor base body surrounded by the glass layer 220, and a cathode electrode 224 is formed on a back surface of the semiconductor base body. Annealing of the anode electrode 222 and the cathode electrode 224 is performed at a temperature of 600 degrees under a nitrogen atmosphere, for example.

(h) Semiconductor Base Body Cutting Step

Figure 4D:
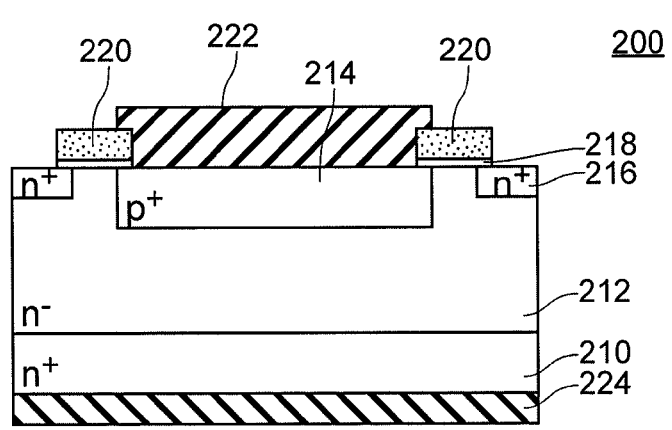

Next, the semiconductor base body is cut by dicing or the like thus dividing the semiconductor base body into chips whereby semiconductor devices (planer-type pn diodes) 200 are manufactured (see FIG. 4(d)).

Through the above-mentioned steps, the semiconductor devices 200 of the embodiment 2 can be manufactured.

According to the method of manufacturing a semiconductor device and such a semiconductor device of the embodiment 2, as can be also clearly found from examples described later, it becomes possible to provide a semiconductor device having high breakdown strength using a glass material containing no lead in the same manner as a conventional case where "a glass material containing lead silicate as a main component" is used.

That is, the method of manufacturing a semiconductor device and such a semiconductor device of the embodiment 2, in the same manner as the method of manufacturing a semiconductor device and such a semiconductor device of the embodiment 1, can satisfy all of the following conditions (a) to (d), that is, the condition (a) that the glass material can be baked at a proper temperature (900° or below, for example), the condition (b) that the glass material can withstand chemicals used in steps, the condition (c) that the glass material has a linear expansion coefficient close to a linear expansion coefficient of silicon (particularly, an average linear expansion coefficient at a temperature of 50° C. to 550° C. being close to a linear expansion coefficient of silicon at a temperature of 50° C. to 550° C.) so as to prevent the warping of a wafer during steps, and the condition (d) that the glass material has excellent insulation property.

According to the method of manufacturing a semiconductor device and such a semiconductor device of the embodiment 2, the insulation layer 218 having higher wettability than the semiconductor base body is interposed between the semiconductor base body and the glass layer 220 and hence, in the same manner as the method of manufacturing a semiconductor device and such a semiconductor device of the embodiment 1, it is possible to make bubbles hardly generated from a boundary surface between the semiconductor base body and the glass layer 220 in step of forming the glass layer by baking the layer made of glass composition. Accordingly, it is possible to suppress the generation of bubbles without adding a component having a defoaming action such as nickel oxide or with the addition of a small amount (for example, 2.0 mol % or less) of such a component having a defoaming action even when the component is added.

Further, according to the method of manufacturing a semiconductor device and such a semiconductor device of the embodiment 2, the insulation layer 218 is interposed between the semiconductor base body and the glass layer 220 and hence, in the same manner as the method of manufacturing a semiconductor device and such a semiconductor device of the embodiment 1, insulation property is enhanced whereby it is possible to manufacture a semiconductor device having a low reverse direction leak current in a stable manner regardless of the composition of the glass layer and the baking condition of the glass layer. That is, even when the content of $SiO_2$ is 55 mol % or more or even when a baking time is set to approximately 15 minutes, it is possible to manufacture a semiconductor device having a low reverse direction leak current in a stable manner.

Further, according to the method of manufacturing a semiconductor device and such a semiconductor device of the embodiment 2, the glass layer 220 is formed by baking the layer made of glass composition for protecting a semiconductor junction which is made of fine glass particles prepared from a material in a molten state which is obtained by melting a raw material which contains at least $SiO_2$, $Al_2O_3$, $B_2O_3$, ZnO, and at least two oxides of alkaline earth metals selected from a group consisting of CaO, MgO and BaO, and substantially contains none of Pb, As, Sb, Li, Na and K. Accordingly, in the same manner as the method of manufacturing a semiconductor device and such a semiconductor device of the embodiment 1, baking of the glass layer can be performed at a relatively low temperature and hence, the crystallization of the glass layer hardly occurs in step of baking the glass layer. Also due to such a technical feature, it is possible to manufacture a semiconductor device having a low reverse direction leak current in a stable manner.

Further, according to the method of manufacturing a semiconductor device and such a semiconductor device of the embodiment 2, the glass layer 220 is formed by baking the layer made of glass composition for protecting a semiconductor junction which contains none of components which constitute the raw material in the form of a filler. Accordingly, in the same manner as the method of manufacturing a semiconductor device and such a semiconductor device of the embodiment 1, the crystallization of the glass layer hardly occurs in step of baking the glass layer. Also due to such a technical feature, it is possible to manufacture a semiconductor device having a low reverse direction leak current in a stable manner.

Further, according to the method of manufacturing a semiconductor device and such a semiconductor device of the embodiment 2, in the same manner as the method of manufacturing a semiconductor device and such a semiconductor device of the embodiment 1, when a resin-sealed-type semiconductor device is formed by molding the semiconductor device of the embodiment 2 with a resin, there is no possibility that highly concentrated ion is induced on an interface between the mold resin and the glass layer and an interface between the glass layer and the semiconductor layer in the midst of carrying out a high temperature reverse bias test. As a result, the semiconductor device of the present invention can acquire an advantageous effect that resistance against a high temperature reverse bias is increased compared to the conventional resin-sealed-type semiconductor device which is formed by molding a semiconductor device obtained by using "a glass material containing lead silicate as a main component" with a resin.

Further, according to the method of manufacturing a semiconductor device and such a semiconductor device of the embodiment 2, the glass composition which substantially contains none of Li, Na and K is used and hence, as can be also clearly found from examples described later (evaluation aspect 10), even when the glass composition contains B (boron), there is no possibility that B (boron) is diffused into silicon from the glass layer during baking of the glass composition whereby a highly reliable semiconductor device can be manufactured.

[Embodiment 3]

In the same manner as the method of manufacturing a semiconductor device of the embodiment 1, the method of manufacturing a semiconductor device of the embodiment 3 is a method of manufacturing a semiconductor device which includes, in the following order: a first step of preparing a silicon-made semiconductor element which includes a pn junction exposure portion where a pn junction is exposed; a second step of forming an insulation layer such that the insulation layer covers the pn junction exposure portion; and a third step of forming a glass layer on the insulation layer where a layer made of glass composition for protecting a semiconductor junction is formed on the insulation layer and, thereafter, the layer made of glass composition for protecting a semiconductor junction is baked. Further, in the same manner as the method of manufacturing a semiconductor device of the embodiment 1, as the glass composition for protecting a semiconductor junction, used is a glass composition for protecting a semiconductor junction which is made of fine glass particles prepared from a material in a molten state which is obtained by melting a raw material which contains at least $SiO_2$, $Al_2O_3$, $B_2O_3$, ZnO, and at least two oxides of alkaline earth metals selected from a group consisting of CaO, MgO and BaO, and substantially contains none of Pb, As, Sb, Li, Na and K, and the glass composition for protecting a semiconductor junction contains none of components which constitute the raw material in the form of a filler. The semiconductor device of the embodiment 3 is a semiconductor device manufactured by the method of manufacturing a semiconductor device of the embodiment 3.

Here, the method of manufacturing a semiconductor device and such a semiconductor device of the embodiment 3 differ from the method of manufacturing a semiconductor device and such a semiconductor device of the embodiment 1 with respect to the constitution of a raw material for fine glass particles.

That is, in the method of manufacturing a semiconductor device and such a semiconductor device of the embodiment 3, as a raw material for forming the fine glass particles, used is a raw material where the content of $SiO_2$ falls within a range from 49.5 mol % to 64.3 mol %, the content of $B_2O_3$ falls within a range from 8.4 mol % to 17.9 mol %, the content of $Al_2O_3$ falls within a range from 3.7 mol % to 14.8 mol %, the content of ZnO falls within a range from 3.9 mol % to 14.2 mol %, and the content of oxide of an alkaline earth metal falls within a range from 7.4 mol % to 12.9 mol %.

The raw material contains all of CaO, MgO and BaO as oxide of the alkaline earth metal. The content of CaO falls within a range from 2.0 mol % to 5.3 mol %, the content of MgO falls within a range from 1.0 mol % to 2.3 mol %, and the content of BaO falls within a range from 2.6 mol % to 5.3 mol %. In the raw material, the sum of the content of $SiO_2$ and the content of $B_2O_3$ falls within a range from 65 mol % to 75 mol %. An average linear expansion coefficient of the glass composition for protecting a semiconductor junction within a temperature range from 50° C. to 550° C. falls within a range from $3.33 \times 10^{-6}$ to $4.08 \times 10^{-6}$.

In this manner, the method of manufacturing a semiconductor device and such a semiconductor device of the embodiment 3 differ from the method of manufacturing a semiconductor device and such a semiconductor device of the embodiment 1 with respect to the constitution of a raw material for fine glass particles. However, in the same manner as the method of manufacturing a semiconductor device of the embodiment 1, the method of manufacturing a semiconductor device of the embodiment 3 is a method of manufacturing a semiconductor device which includes, in the following order: a first step of preparing a semiconductor element which includes a pn junction exposure portion where a pn junction is exposed; a second step of forming an insulation layer such that the insulation layer covers the pn junction exposure portion; and a third step of forming a glass layer on the insulation layer where a layer made of glass composition for protecting a semiconductor junction is formed on the insulation layer and, thereafter, the layer made of glass composition for protecting a semiconductor junction is baked. Further, as the glass composition for protecting a semiconductor junction, used is a glass composition for protecting a semiconductor junction which is made of fine glass particles prepared from a material in a molten state which is obtained by melting a raw material which contains at least $SiO_2$, $Al_2O_3$, $B_2O_3$, ZnO, and at least two oxides of alkaline earth metals selected from a group consisting of CaO, MgO and BaO, and substantially contains none of Pb, As, Sb, Li, Na and K, and the glass composition for protecting a semiconductor junction contains none of components which constitute the raw material in the form of a filler. Accordingly, the method of manufacturing a semiconductor device and such a semiconductor device of the embodiment 3 have substantially same advantageous effects as the method of manufacturing a semiconductor device and such a semiconductor device of the embodiment 1.

That is, according to the method of manufacturing a semiconductor device and such a semiconductor device of the embodiment 3, as can be also clearly found from examples described later, it becomes possible to provide a semiconductor device having high breakdown strength using a glass material containing no lead in the same manner as a conventional case where "a glass material containing lead silicate as a main component" is used. In other words, the method of manufacturing a semiconductor device and such a semiconductor device of the embodiment 3, in the same manner as the method of manufacturing a semiconductor device and such a semiconductor device of the embodiment 1, can satisfy all of the following conditions (a) to (d), that is, the condition (a) that the glass material can be baked at a proper temperature (900° C. or below, for example), the condition (b) that the glass material can withstand chemicals used in steps, the condition (c) that the glass material has a linear expansion coefficient close to a linear expansion coefficient of silicon (particularly, an average linear expansion coefficient at a temperature of 50° C. to 550° C. being close to a linear expansion coefficient of silicon at a temperature of 50° C. to 550° C.) so as to prevent the warping of a wafer during steps, and the condition (d) that the glass material has excellent insulation property.

According to the method of manufacturing a semiconductor device and such a semiconductor device of the embodiment 3, the insulation layer having higher wettability than the semiconductor base body is interposed between the semiconductor base body and the glass layer and hence, in the same manner as the method of manufacturing a semiconductor device and such a semiconductor device of the embodiment 1, it is possible to make bubbles hardly generated from a boundary surface between the semiconductor base body and the glass layer in step of forming the glass layer by baking the layer made of glass composition. Accordingly, it is possible to suppress the generation of bubbles without adding a component having a defoaming action such as nickel oxide or with the addition of a small amount (for example, 2.0 mol % or less) of such a component having a defoaming action even when the component is added.

Further, according to the method of manufacturing a semiconductor device and such a semiconductor device of the embodiment 3, the insulation layer is interposed between the semiconductor base body and the glass layer and hence, in the same manner as the method of manufacturing a semiconductor device and such a semiconductor device of the embodiment 1, insulation property is enhanced whereby it is possible to manufacture a semiconductor device having a low reverse direction leak current in a stable manner regardless of the composition of the glass layer and the baking condition of the glass layer. That is, even when the content of $SiO_2$ is 55 mol % or more or even when a baking time is set to approximately 15 minutes, it is possible to manufacture a semiconductor device having a low reverse direction leak current in a stable manner.

Further, according to the method of manufacturing a semiconductor device and such a semiconductor device of the embodiment 3, a glass layer is formed by baking the layer made of glass composition for protecting a semiconductor junction which is made of fine glass particles prepared from a material in a molten state which is obtained by melting a raw material which contains at least $SiO_2$, $Al_2O_3$, $B_2O_3$, ZnO, and at least two oxides of alkaline earth metals selected from a group consisting of CaO, MgO and BaO, and substantially contains none of Pb, As, Sb, Li, Na and K. Accordingly, in the same manner as the method of manufacturing a semiconductor device and such a semiconductor device of the embodiment 1, baking of the glass layer can be performed at a relatively low temperature and hence, the crystallization of the glass layer hardly occurs in step of baking the glass layer. Also due to such a technical feature, it is possible to manufacture a semiconductor device having a low reverse direction leak current in a stable manner.

Further, according to the method of manufacturing a semiconductor device and such a semiconductor device of the embodiment 3, the glass layer 124 is formed by baking the layer made of glass composition for protecting a semiconductor junction which contains none of components which constitute the raw material in the form of a filler. Accordingly, in the same manner as the method of manufacturing a semiconductor device and such a semiconductor device of the embodiment 1, the crystallization of the glass layer hardly occurs in step of baking the glass layer. Also due to such a technical feature, it is possible to manufacture a semiconductor device having a low reverse direction leak current in a stable manner.

Further, according to the method of manufacturing a semiconductor device and such a semiconductor device of the embodiment 3, in the same manner as the method of manufacturing a semiconductor device and such a semiconductor device of the embodiment 1, when a resin-sealed-type semiconductor device is formed by molding the semiconductor device of the embodiment 3 with a resin, there is no possibility that highly concentrated ion is induced on an interface between the mold resin and the glass layer and an interface between the glass layer and the semiconductor layer in the midst of carrying out a high temperature reverse bias test. As a result, the semiconductor device of the present invention can acquire an advantageous effect that resistance against a high temperature reverse bias is increased compared to the conventional resin-sealed-type semiconductor device which is formed by molding a semiconductor device obtained by using "a glass material containing lead silicate as a main component" with a resin.

Further, according to the method of manufacturing a semiconductor device and such a semiconductor device of the embodiment 3, the glass composition which substantially contains none of Li, Na and K is used and hence, as can be also clearly found from examples described later (evaluation aspect 10), even when the glass composition contains B (boron), there is no possibility that B (boron) is diffused into silicon from the glass layer during baking of the glass composition whereby a highly reliable semiconductor device can be manufactured.

EXAMPLES

1. Preparation of Specimens

FIG. 5 is a table showing conditions and results of examples. In the examples, raw materials are prepared to have composition ratios described in examples 1 to 11 and comparison examples 1 to 6 (see FIG. 5), these raw materials are sufficiently mixed by a mixer and, thereafter, the mixed raw material is put into a platinum crucible whose temperature is elevated to a predetermined temperature (1350° C. to 1550° C.) in an electric furnace and is melted for two hours. Thereafter, the material in a molten state is made to flow out from the crucible and is fed to water-cooled rolls so that glass flakes in a flaky shape are obtained. Thereafter, the glass flakes are pulverized by a ball mill until the glass flakes obtain an average particle size of 5 μm thus obtaining powdery glass composition.

The raw materials used in the examples are $SiO_2$, $Al_2O_3$, $H_3BO_3$, ZnO, $CaCO_3$, MgO, $BaCO_3$, NiO (nickel oxide), $ZrO_2$, PbO, $K_2O$ and $Na_2O$.

2. Evaluation

The respective glass compositions obtained by the above-mentioned methods are evaluated with respect to the following evaluation aspects. Out of the evaluation aspects 1 to 9, with respect to the evaluation aspects 5, 6, 8 and 9, a glass layer is formed on an insulation layer in examples 1 to 11, while a glass layer is directly formed on a semiconductor base body in comparison examples 1 to 6. Baking of the glass layers is performed at a temperature of 800° C. to 900° C. for 15 minutes. The glass compositions in the examples 1 to 3 are glass compositions included in the glass composition used in the embodiment 1, and the glass compositions in the examples 4 to 11 are glass compositions included in the glass composition used in the embodiment 3. The glass composition of the comparison example 1 is the conventional "glass composition containing lead silicate as a main component". Further, the glass composition of the comparison example 2 is the conventionally known "lead-free glass composition (zinc-based passivation glass GP014 made by Nippon Electric Glass Co., Ltd.). The glass composition of the comparison example 3 is equal to the glass composition of the example 6. The glass composition of the comparison example 4 has the glass composition of the example 6 as the base composition and further contains 3.0 mol % of NiO (nickel oxide). The glass composition of the comparison example 5 is equal to the glass composition of the example 1. The glass composition of the comparison example 6 is the glass composition which also contains B and alkaline metal ($SiO_2$—$B_2O_3$—$K_2O$—$Na_2O$ based glass composition).

(1) Evaluation Aspect 1 (Environmental Load)

One of the objects of the present invention lies in that a semiconductor device having high breakdown strength can be manufactured by using a glass material containing no lead in the same manner as the conventional case where "a glass material containing lead silicate as a main component" is used and hence, the score "good" is given when the glass composition contains no lead component, and the score "bad" is given when the glass composition contains a lead component.

(2) Evaluation Aspect 2 (Baking Temperature)

When the baking temperature is excessively high, the baking temperature largely influences a semiconductor device under manufacture. Accordingly, the score "good" is given when the baking temperature is equal to or below 900° C., and the score "bad" is given when the baking temperature exceeds 900° C.

(3) Evaluation Aspect 3 (Chemical Resistance)

The score "good" is given when the glass composition exhibits insolubility to both aqua regia and a plating solution, and the score "bad" is given when the glass composition exhibits solubility to at least one of aqua regia and a plating solution.

(4) Evaluation Aspect 4 (Average Linear Expansion Coefficient)

Flaky glass plates are prepared from a material in a molten state which is obtained in "1. Preparation of specimens" described above, and an average linear expansion coefficient of the glass composition at a temperature of 50° C. to 550° C. is measured using such flaky glass plates. As a result, the score "good" is given when the difference between an average linear expansion coefficient of the glass composition and a linear expansion coefficient ($3.73 \times 10^{-6}$) of silicon at a temperature of 50° C. to 550° C. is equal to or less than "$0.7 \times 10^{-6}$", and the score "bad" is given when the difference exceeds "$0.7 \times 10^{-6}$". The measurement of an average linear expansion coefficient is performed by a total expansion measurement method (temperature elevation speed: 10° C./min) using a thermal mechanical analysis device TMA-60 made by Shimadzu Corp, wherein a silicon monocrystalline member having a length of 20 mm is used as a reference specimen.

(5) Evaluation Aspect 5 (Presence or Non-Presence of Crystallization)

In step of preparing a semiconductor device (pn diode) by a method substantially equal to the method of manufacturing a semiconductor device of the embodiment 1, the score "good" is given when the vitrification without causing crystallization is possible, and the score "bad" is given when the vitrification is not possible due to crystallization.

(6) Evaluation Aspect 6 (Presence or Non-Presence of Generation of Bubbles)

A semiconductor device (pn diode) is manufactured by the same method as the method of manufacturing a semiconductor device of the embodiment 1, and it is observed whether or not bubbles are generated in the inside of the glass layer 124 (particularly, in the vicinity of a boundary surface between the glass layer 124 and the semiconductor base body) (preliminary evaluation). Further, a layer made of glass composition is formed by applying by coating the glass composition according to the examples 1 to 11 and the comparison examples 1 to 6 on the semiconductor base body having a size of 10 mm square, and the layer made of glass composition is baked thus forming the glass layer. Then, it is observed whether or not bubbles are generated in the inside of the glass layer (particularly, in the vicinity of the boundary surface between the glass layer and the semiconductor base body) (subsequent evaluation).

FIG. 6(a) and FIG. 6(b) are views for explaining bubbles b generated in the inside of the glass layer 124 in the preliminary evaluation. FIG. 6(a) is a cross-sectional view of a semiconductor device when the bubbles b are not generated, while FIG. 6(b) is a cross-sectional view of a semiconductor device when the bubbles b are generated. FIGS. 7(a) and 7(b) are photographs for explaining the bubbles b generated in the inside of the glass layer 124 in subsequent evaluation. FIG. 7(a) is a photograph showing a boundary surface between the semiconductor base body and the glass layer when the bubbles b are not generated in an enlarged manner, while FIG. 7(b) is a photograph showing a boundary surface between the semiconductor base body and the glass layer when the bubbles b are generated in an enlarged manner. As a result of the experiment, it is found that there is a favorable corresponding relationship between the result of the preliminary evaluation and the result of the subsequent evaluation of the present invention. In the subsequent evaluation, the score "good" is given when no bubble having a diameter of 50 μm or more is generated in the inside of the glass layer, the score "fair" is given when one to twenty bubbles having a diameter of 50 μm or more are generated in the inside of the glass layer, and the score "bad" is given when twenty one or more bubbles having a diameter of 50 μm or more are generated in the inside of the glass layer.

Figure 8:
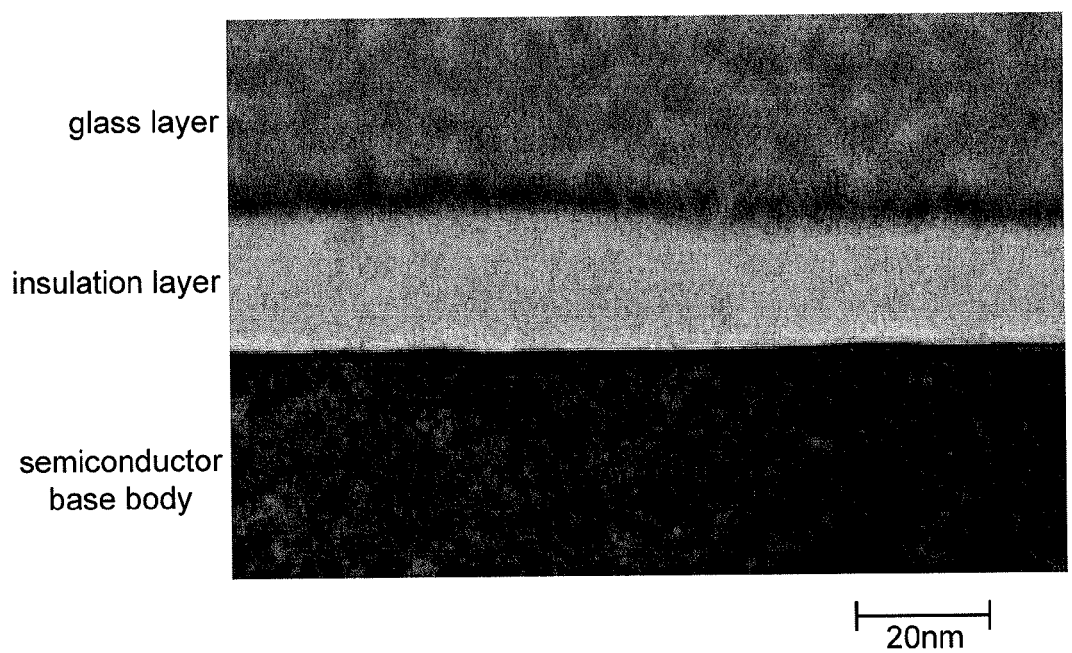
FIG. 8 is a TEM photograph showing a cross section of a portion including a boundary between a semiconductor base body and a glass layer.

FIG. 8 is a TEM photograph showing a cross section of a portion including a boundary between a semiconductor base body and a glass layer. As can be also found from FIG. 8, it is clearly confirmed that an insulation layer (layer thickness: approximately 20 nm) is present between the semiconductor base body and the glass layer.

(7) Evaluation Aspect 7 (Presence or Non-Presence of Addition of Nickel Oxide)

One of objects of the present invention lies in "to suppress the generation of bubbles which may be generated from a boundary surface between a semiconductor base body and the glass layer in step of forming the glass layer by baking a layer made of glass composition without adding a component having a defoaming action such as nickel oxide or with the addition of a small amount (for example, 2.0 mol % or less) of such a component having a defoaming action even when the component is added. Accordingly, the score "very good" is given when nickel oxide is not added, the score "good" is given when nickel oxide is added but an addition amount of nickel oxide is 2.0 mol % or less, and the score "bad" is given when the content of nickel oxide exceeds 2.0 mol %.

(8) Evaluation Aspect 8 (Reverse Direction Leak Current)

Figure 9A:
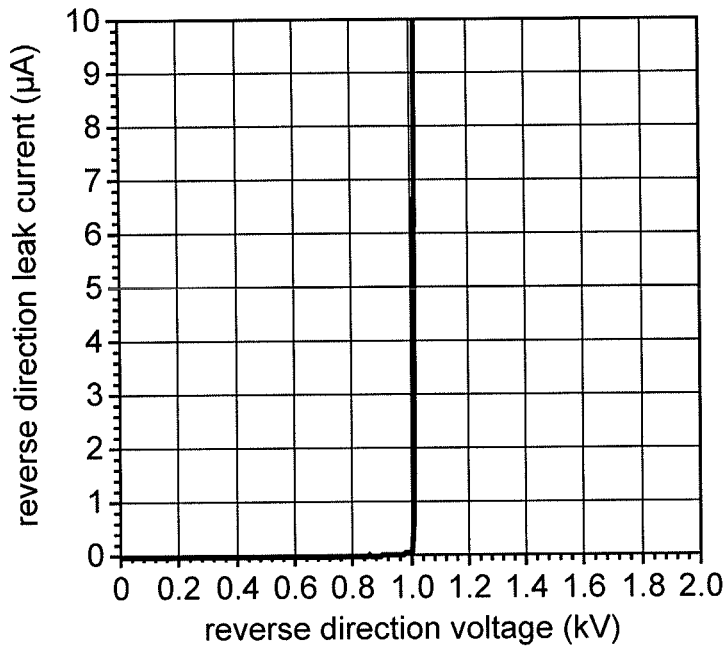
FIG. 9(a) and FIG. 9(b) are graphs showing a reverse direction current in the examples.
Figure 9B:
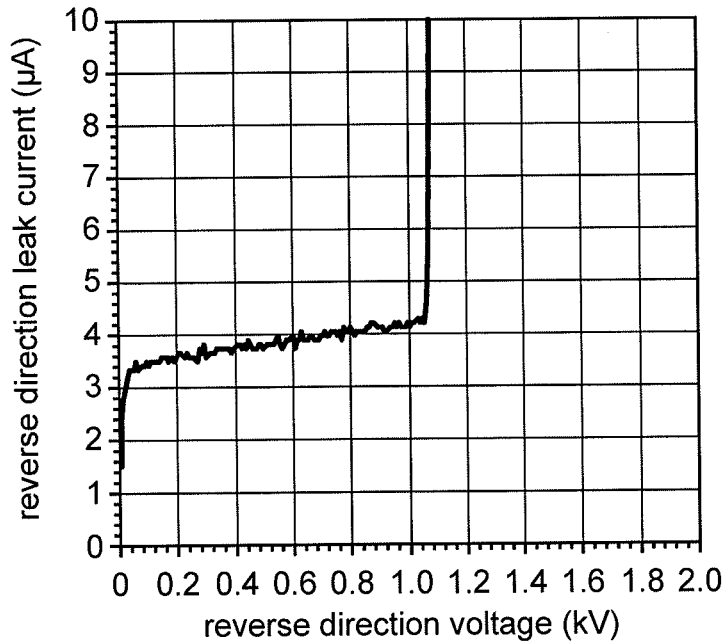

A semiconductor device (pn diode) is prepared in the same manner as the method of manufacturing a semiconductor device of the embodiment 1, and a reverse direction leak current of the prepared semiconductor device is measured. FIG. 9 is a view showing reverse direction leak currents in the examples. In FIG. 9, FIG. 9(a) is a view showing a reverse direction leak current in the example 1, and FIG. 9(b) is a view showing a reverse direction leak current in the comparison example 5. As a result of the evaluation, the score "good" is given when a reverse direction leak current is 1 μA or less when a reverse direction voltage VR of 600V is applied, and the score "bad" is given when the reverse direction leak current IR exceeds 1 μA when the reverse direction voltage VR of 600V is applied.

(9) Evaluation Aspect 9 (High-Temperature Reverse Bias Resistance)

A resin-sealed-type semiconductor device is formed by molding a semiconductor device which is prepared by a method substantially equal to the method of manufacturing a semiconductor device of the embodiment 1. The resin-sealed-type semiconductor device is subjected to a high-temperature reverse bias resistance test, and the high-temperature reverse bias resistance is measured. The high-temperature reverse bias resistance test is performed such that a specimen is put into a constant-temperature bath/high temperature bias tester where a temperature condition is set to 175° C., and a reverse direction current is measured for every 5 minutes over 20 hours in a state where a potential of 600V is applied between an anode electrode and a cathode electrode.

Figure 10:
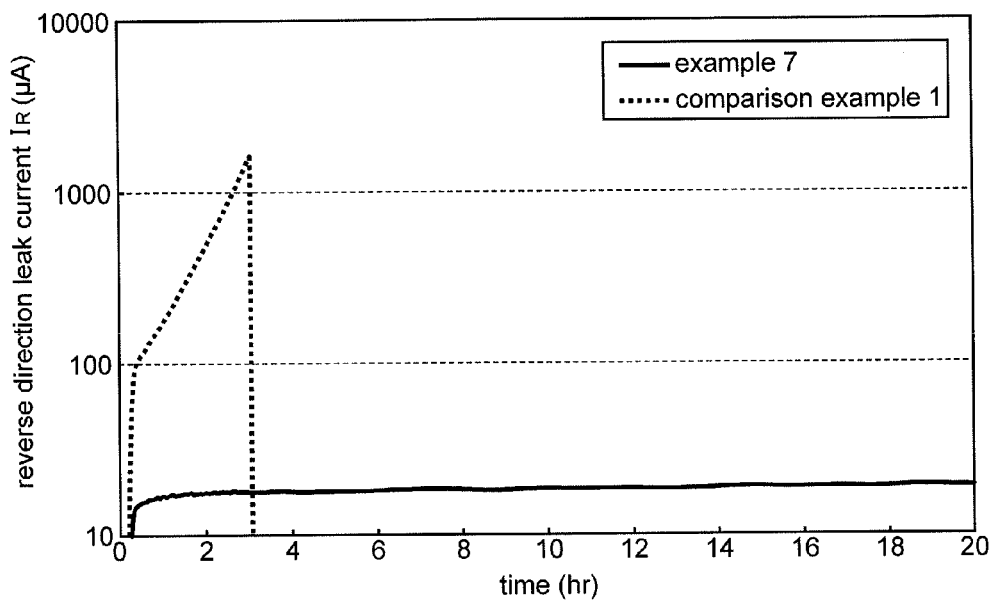
FIG. 10 is a graph showing a result of a high temperature reverse bias test.

FIG. 10 is a view showing a result of the high temperature reverse bias test. In FIG. 10, a solid line indicates a reverse direction leak current with respect to a specimen prepared using the glass composition of the example 1, and a broken line indicates a reverse direction leak current with respect to a specimen prepared using the glass composition of the comparison example 1. As shown in FIG. 10, it is found that with respect to the specimen prepared using the glass composition of the comparison example 1, a reverse direction leak current is increased immediately after the high temperature reverse bias test is started along with the temperature elevation, the reverse direction leak current is further increased thereafter with time, and reaches a predetermined reverse direction leak current value after the lapse of 3 hours from starting the high temperature reverse bias test so that the high temperature reverse bias test was stopped. To the contrary, it is found that with respect to the specimen prepared using the glass composition of the example 1, although a reverse direction leak current is increased immediately after the high temperature reverse bias test is started along with the temperature elevation, the reverse direction leak current is hardly increased after such increase of the reverse direction leak current. The score "good" is given when a reverse direction leak current is increased immediately after the high temperature reverse bias test is started along with the temperature elevation but the reverse direction leak current is hardly increased after such increase of the reverse direction leak current, and the score "bad" is given when a reverse direction leak current is increased immediately after the high temperature reverse bias test is started along with the temperature elevation, and the reverse direction leak current is further increased thereafter with time.

(10) Evaluation Aspect 10 (Presence or Non-Presence of Diffusion of B from Glass Layer)

A glass composition layer is formed on a surface of an n-type silicon substrate (impurity concentration: $2.0 \times 10^{14}$ cm$^{-3}$) by an electrophoresis method and, thereafter, a glass layer is formed by baking the glass composition layer at a temperature of 800° C. in a wet oxygen atmosphere. As the glass composition, the glass composition of the example 1 and the glass composition of the comparison example 6 are used. Then, a surface of the n-type silicon substrate is exposed by removing the glass layer using fluorine. Thereafter, the SRP (Spreading Resistance Profiler) distribution is measured using a spreading resistance measurement device (SSM2000 made by Japan SSM Co; Ltd.) in the depth direction from a surface of the n-type silicon substrate, and impurity concentration is calculated based on obtained spreading resistance.

Figure 11:
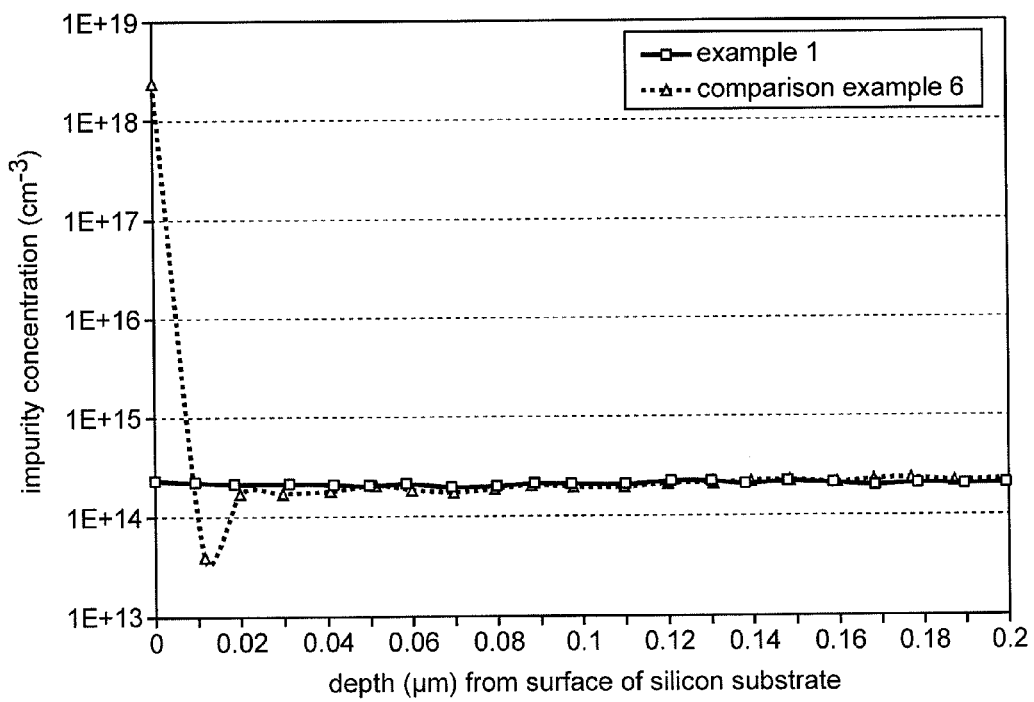
FIG. 11 is a graph showing the distribution of impurity concentration in the depth direction from a surface of a silicon substrate.
Figure 12A:
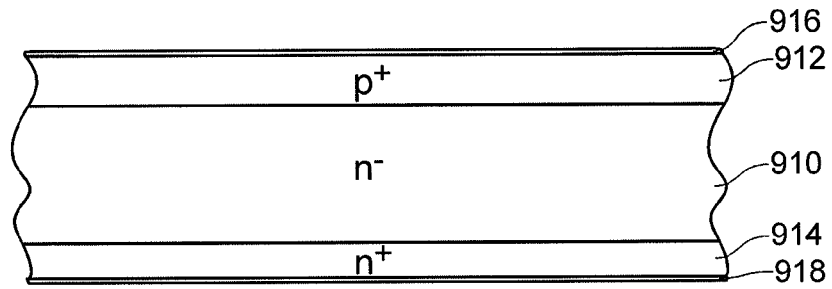
FIG. 12(a) to FIG. 12(d) are views for explaining a conventional method of manufacturing a semiconductor device.
Figure 12B:
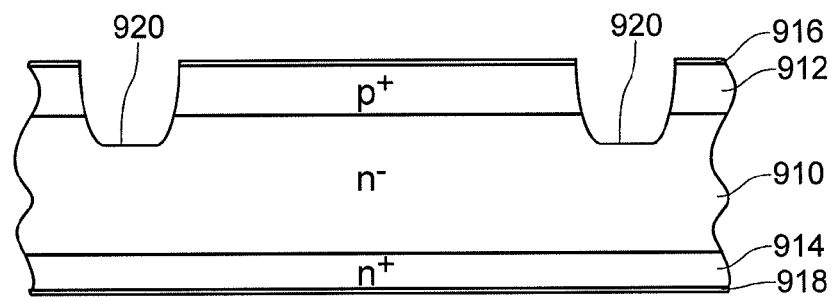
Figure 12C:
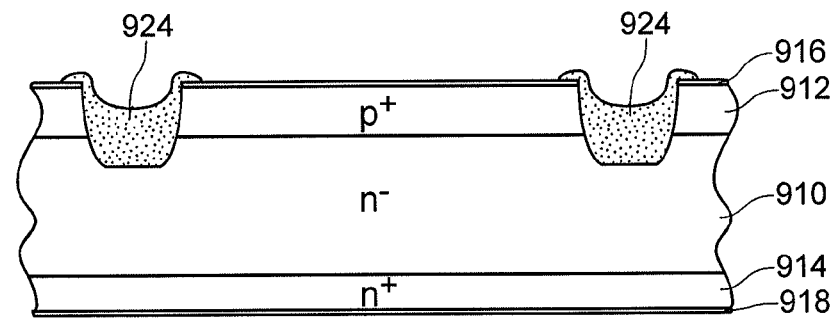
Figure 12D:
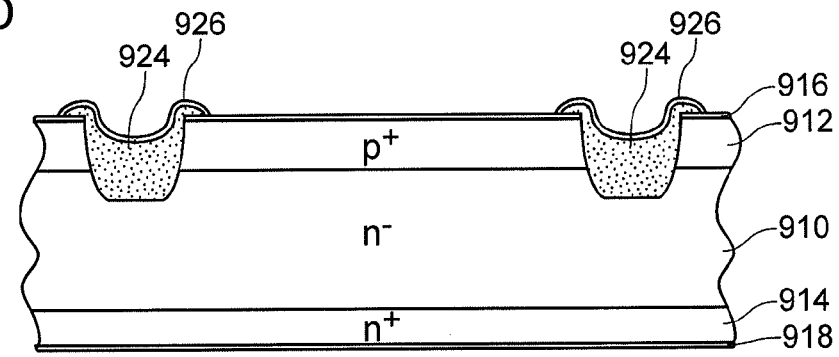
Figure 13A:
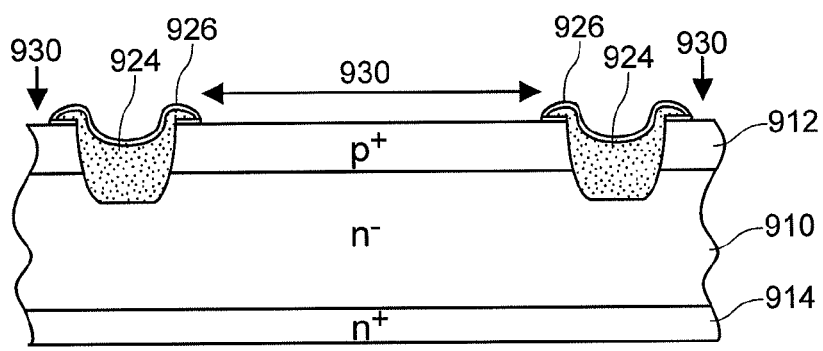
FIG. 13(a) to FIG. 13(d) are views for explaining the conventional method of manufacturing the semiconductor device.
Figure 13B:
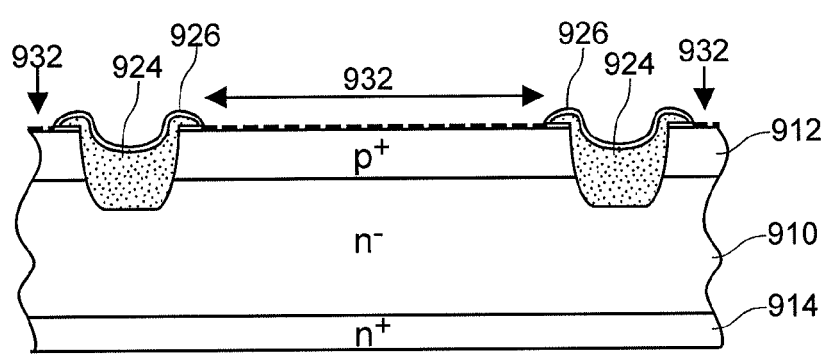
Figure 13C:
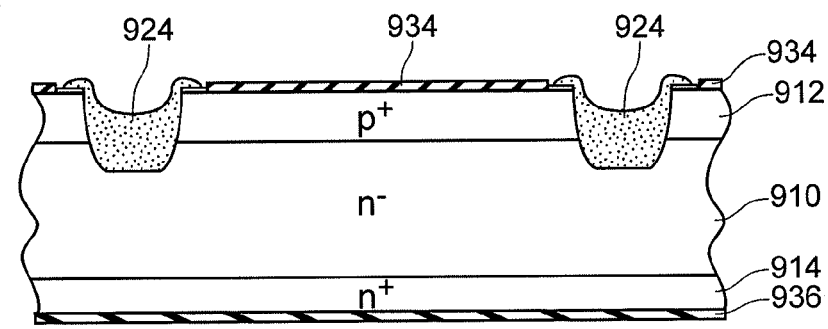
Figure 13D:
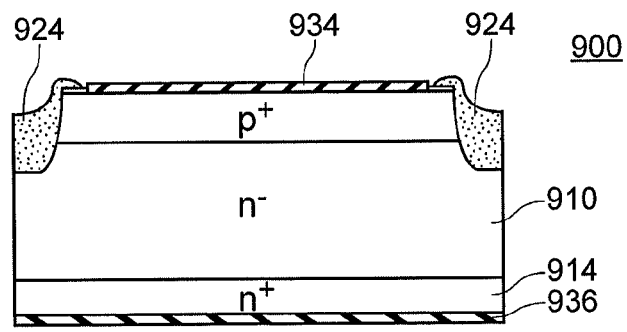

FIG. 11 is a view showing the distribution of impurity concentration in the depth direction from a surface of a silicon substrate. In FIG. 11, a solid line indicates the distribution of impurity concentration with respect to a specimen prepared using the glass composition of the example 1, and a broken line indicates the distribution of impurity concentration with respect to a specimen prepared using the glass composition of the comparison example 6. As shown in FIG. 11, it is found that, in the specimen prepared using the glass composition of the comparison example 6, a p-type impurity layer having a depth of 10 nm is formed on a surface of the silicon substrate. This implies that, in the glass composition which contains both B (boron) and alkaline metal, B (boron) diffuses into the silicon substrate from the glass layer during baking of the glass composition. To the contrary, it is found that, in the specimen prepared using the glass composition of the example 1, a p-type impurity layer is not formed on the surface of the silicon substrate. This implies that, in the glass composition which contains no alkaline metal, even when the glass composition contains B(boron), B(boron) is not diffused into the silicon substrate from the glass layer during baking of the glass composition. Accordingly, the score "good" is given when the glass composition is the glass composition which contains B(boron) but does not allow B(boron) to be diffused into the silicon substrate from the glass layer during baking of the glass composition, and the score "bad" is given when the glass composition is the glass composition where B (boron) is diffused into the silicon substrate from the glass layer during baking of the glass composition.

(10) Comprehensive Evaluation

The score "good" is given when "fair" or "bad" is given with respect to none of the above-mentioned evaluation aspects 1 to 10, and the score "bad" is given when "fair" or "bad" is given with respect to at least one of the above-mentioned evaluation aspects 1 to 10.

3. Result of Evaluation

As can be found from FIG. 5, the score "bad" is given to all comparison examples 1 to 6 with respect to any one of the evaluation aspects so that the comprehensive evaluation of "bad" is given to all of the comparison examples 1 to 6. That is, score "bad" is given to the comparison example 1 with respect to the evaluation aspects 1, 9. The score "bad" is given to the comparison example 2 with respect to the evaluation aspect 3. The score "bad" is given to the comparison example 3 with respect to the evaluation aspect 6. The score "bad" is given to the comparison example 4 with respect to the evaluation aspects 5, 7. The score "bad" is given to the comparison example 5 with respect to the evaluation aspect 8. The score "bad" is given to the comparison example 6 with respect to the evaluation aspects 8, 10.

To the contrary, the score "good" is given to the example 1 with respect to all evaluation aspects (evaluation aspects 1 to 10), and the score "good" or "very good" is given to the examples 2 to 11 with respect to the evaluation aspects 1 to 9. As a result, it is found that all of the methods of manufacturing a semiconductor device of the examples 1 to 11 are methods of manufacturing a semiconductor device which can manufacture a semiconductor device capable of satisfying all of the following conditions (a) to (d) using glass materials containing no lead, that is, the condition (a) that the glass material can be baked at a proper temperature (900° C. or below, for example), the condition (b) that the glass material can withstand chemicals used in steps, the condition (c) that the glass material has a linear expansion coefficient close to a linear expansion coefficient of silicon (particularly, an average linear expansion coefficient at a temperature of 50° C. to 550° C. being close to a linear expansion coefficient of silicon at a temperature of 50° C. to 550° C.), and the condition (d) that the glass material has excellent insulation property.

It is found that all of the methods of manufacturing a semiconductor device according to the examples 1 to 11 are methods of manufacturing a semiconductor device which can manufacture a semiconductor device capable of also satisfying the following conditions (e) to (i) using glass materials containing no lead, that is, the condition (e) that the glass material is not crystallized in vitrification step, the condition (f) that the occurrence of a state where a reverse direction breakdown strength characteristic of the semiconductor device is deteriorated is suppressed by suppressing the generation of bubbles which may be generated from a boundary surface between a semiconductor base body and the glass layer in step of forming the glass layer by baking "a layer made of glass composition" formed by an electrophoresis method, the condition (g) that an addition amount of NiO (nickel oxide) can be suppressed to 2.0 mol % or less as a result of the suppression of the deterioration of a reverse direction breakdown strength characteristic of the semiconductor device, the condition (h) that a reverse direction leak current is low, and the condition (i) that the glass material has high high-temperature reverse bias resistance.

As shown in FIG. 9(b), although the semiconductor device manufactured by the method of manufacturing a semiconductor device of the comparison example 5 exhibits a higher reverse direction current than the semiconductor device manufactured by the method of manufacturing a semiconductor device of the example 1, the semiconductor device manufactured by the method of manufacturing a semiconductor device of the comparison example 5 exhibits a reverse direction current of approximately 4.0 μA when a reverse direction voltage VR of 600V is applied and hence, the semiconductor device manufactured by the method of manufacturing a semiconductor device of the comparison example 5 is at a sufficiently usable level depending on usage.

Although the method of manufacturing a semiconductor device and such a semiconductor device according to the present invention have been explained heretofore in conjunction with the above-mentioned embodiments, the present invention is not limited to the above-mentioned embodiments, and various modifications of the present invention can be carried out including the following modifications, for example, without departing from the gist of the present invention.

(1) In the above-mentioned respective embodiments, the glass layer is formed using the glass composition for protecting a semiconductor junction described in the embodiment 1. However, the present invention is not limited to such a case. The glass layer may be formed using the glass composition for protecting a semiconductor junction containing no NiO (nickel oxide).

(2) In the above-mentioned respective embodiments, the glass layer is formed by an electrophoresis method. However, the present invention is not limited to such a case. For example, the glass layer may be formed by a spin coating method, a screen printing method or other glass layer forming methods.

(3) In the above-mentioned respective embodiments, the glass layer is formed by an electrophoresis method while setting a thickness of the insulation layer within a range of 5 nm to 60 nm. However, the present invention is not limited to such a case. For example, the glass layer may be formed by a spin coating method, a screen printing method or other glass layer forming methods while setting a thickness of the insulation layer within a range of 5 nm to 100 nm. In this case, when a thickness of the insulation layer is less than 5 nm, there exists a possibility that a reverse direction current reduction effect cannot be obtained. On the other hand, when a thickness of the insulation layer exceeds 100 nm, there exists a possibility that a layer made of the high-quality glass composition cannot be formed by a spin coating method, a screen printing method or other glass layer forming methods in the next glass layer forming step.

(4) In the above-mentioned respective embodiments, an insulation layer formed of a silicon oxide film is formed by a thermal oxidation method which uses dry oxygen (Dry $O_2$). However, the present invention is not limited to such a case. For example, an insulation layer formed of a silicon oxide film may be formed by a thermal oxidation method which uses dry oxygen and nitrogen (Dry$O_2$+$N_2$). An insulation layer formed of a silicon oxide film may be formed by a thermal oxidation method which uses wet oxygen (Wet$O_2$). An insulation layer formed of a silicon oxide film may be formed by a thermal oxidation method which uses wet oxygen and nitrogen (Wet$O_2$+$N_2$)). An insulation layer formed of a silicon oxide film may be formed by a CVD method. Further, an insulation layer formed of a film other than a silicon oxide film (for example, an insulation layer formed of a silicon nitride film) may be formed.

(5) In the above-mentioned respective embodiments, the present invention has been explained by taking a diode (mesa-type pn diode, planar-type pn diode) as an example. However, the present invention is not limited to such a case. The present invention is also applicable to any kinds of semiconductor devices where a pn junction is exposed (for example, a thyristor, a power MOSFET, an IGBT and the like).

(6) In the above-mentioned respective embodiments, a substrate made of silicon is used as the semiconductor substrate. However, the present invention is not limited to such a case. For example, a semiconductor substrate such as an SiC substrate, a GaN substrate or a GaO substrate can be also used.

(7) In the method of manufacturing a semiconductor device and the semiconductor device according to the present invention, it is desirable to use the glass composition which is hardly crystallized in step of baking the glass composition layer. With the use of such glass composition, a semiconductor device having a low reverse direction leak current can be manufactured in a stable manner. In this respect, the present invention differs from the technique disclosed in JP-A-63-117929 where the glass composition is transformed into a glass ceramic body having high crystallinity in step of baking a glass layer.

(8) In the method of manufacturing a semiconductor device and the semiconductor device according to the present invention, it is desirable to use a raw material which substantially contains no Bi. With the use of such a raw material, the crystallization of the glass layer hardly occurs in step of baking the glass composition layer and hence, a semiconductor device having a low reverse direction leak current can be manufactured in a stable manner. In this respect, the present invention differs from the technique disclosed in JP-A-2005-525287 where a raw material which contains Bi is used.

(9) In the method of manufacturing a semiconductor device and the semiconductor device according to the present invention, it is desirable to use a raw material which substantially contains no Cu. With the use of such a raw material, the crystallization of the glass layer hardly occurs in step of baking the glass composition layer. Also in this case, a semiconductor device having a low reverse direction leak current can be manufactured in a stable manner. In this respect, the present invention differs from the technique disclosed in JP-A-2001-287984 where a raw material which contains Cu is used.

(10) In the method of manufacturing a semiconductor device and the semiconductor device according to the present invention, a raw material which substantially contains neither Li nor Pb is used. In this respect, the present invention differs from the technique disclosed in JP-A-2002-16272 where a raw material which contains Li and Pb is used.

(11) In JP-A-53-36463, there is disclosed a technique where zinc-based glass (glass containing a largest amount of zinc oxide) is used as a glass layer for passivation. However, zinc-based glass exhibits low chemical resistance (see the comparison example 2 in the above-mentioned examples) and hence, the zinc-based glass cannot be handily used in the method of manufacturing a semiconductor device and the semiconductor device according to the present invention.

(12) In the method of manufacturing a semiconductor device and the semiconductor device according to the present invention, it is desirable to use a raw material which substantially contains no P. With the use of such a raw material, it is possible to prevent the diffusion of phosphorus (P) into the semiconductor base body from the glass layer in step of baking the glass composition layer and hence, a highly reliable semiconductor device can be manufactured.

EXPLANATION OF SYMBOLS 100, 200, 900: semiconductor device, 110, 910: n type semiconductor substrate, 112, 912: $p^+$ type diffusion layer, 114, 914: $n^-$ type diffusion layer, 116, 118, 916, 918: oxide film, 120, 920: trench, 121, 218: insulation layer, 124, 220, 924: glass layer, 126, 926: photoresist, 130, 930: portion where Ni plating electrode film is to be formed, 132, 932: roughened surface region, 134, 934: anode electrode, 136, 936: cathode electrode, 210: $n^+$ type semiconductor substrate, 212: $n^-$ type epitaxial layer, 214: $p^+$ type diffusion layer, 216: $n^+$ type diffusion layer, 222: anode electrode layer, 224: cathode electrode layer, b: bubbles

The invention claimed is:
1. A semiconductor device comprising:
   a semiconductor element which includes a pn junction exposure portion where a pn junction is exposed;
   a single-layered oxide film over the semiconductor element, the single-layered oxide film having a first portion covering the pn junction exposure portion; and
   a glass layer covering the first portion of the single-layered oxide film, the glass layer being separated by the single-layered oxide film from the semiconductor element, the glass layer being not in contact with the semiconductor element, the glass layer being in contact with the single-layered oxide film, and the glass layer being formed by forming, over the first portion of the single-layered oxide film, a layer made of a glass composition for protecting a semiconductor junction, and baking the layer made of the glass composition, wherein
   the glass composition is made of fine glass particles prepared from a material in a molten state which is obtained by melting a raw material which contains at least $SiO_2$, $Al_2O_3$, $B_2O_3$, ZnO, and at least two oxides of alkaline earth metals selected from a group consist- ing of CaO, MgO and BaO, and substantially contains none of Pb, As, Sb, Li, Na and K, and the glass composition contains none of components which constitute the raw material in the form of a filler.

2. A method of manufacturing a semiconductor device, the method comprising:

preparing a semiconductor element which includes a pn junction exposure portion where a pn junction is exposed;

forming a single-layered oxide film over the semiconductor element, the single-layered oxide film having a first portion covering the pn junction exposure portion;

forming, over the first portion of the single-layered oxide film, a layer made of a glass composition for protecting a semiconductor junction; and, baking the layer made of the glass composition to form a glass layer covering the first portion of the single-layered oxide film, the glass layer being separated by the single-layered oxide film from the semiconductor element, the glass layer being not in contact with the semiconductor element, and the glass layer being in contact with the single-layered oxide film, wherein the glass composition made of fine glass particles prepared from a material in a molten state which is obtained by melting a raw material which contains at least $SiO_2$, $Al_2O_3$, $B_2O_3$, ZnO, and at least two oxides of alkaline earth metals selected from a group consisting of CaO, MgO and BaO, and substantially contains none of Pb, As, Sb, Li, Na and K, and the glass composition contains none of components which constitute the raw material in the form of a filler.

3. The method according to claim 2, wherein, in the glass composition, the content of $SiO_2$ falls within a range from 41.1 mol % to 61.1 mol %, the content of $Al_2O_3$ falls within a range from 7.4 mol % to 17.4 mol %, the content of $B_2O_3$ falls within a range from 5.8 mol % to 15.8 mol %, the content of ZnO falls within a range from 3.0 mol % to 24.8 mol %, and the content of oxide of an alkaline earth metal falls within a range from 5.5 mol% to 15.5 mol %.

4. The method according to claim 2, wherein, in the glass composition, the content of $SiO_2$ falls within a range from 49.5 mol % to 64.3 mol %, the content of $B_2O_3$ falls within a range from 8.4 mol % to 17.9 mol %, the content of $Al_2O_3$ falls within a range from 3.7 mol % to 14.8 mol %, the content of ZnO falls within a range from 3.9 mol % to 14.2 mol %, and the content of oxide of an alkaline earth metal falls within a range from 7.4 mol % to 12.9 mol %.

5. The method according to claim 2, wherein the raw material substantially contains no P.

6. The method of manufacturing a semiconductor device according to claim 2, wherein the raw material substantially contains no Bi.

7. The method according to claim 2, wherein the glass composition substantially contains no organic binder.

8. The method according to claim 2, wherein baking the layer made of the glass composition includes baking the layer made of the glass composition at a temperature of 900° C. or below in the third step.

9. The method according to claim 2, wherein the single-layered oxide film is made of silicon oxide.

10. The method according to claim 2, wherein forming the single-layered oxide film includes forming the single-layered oxide film with a thickness which falls within a range from 5nm to 100nm.

11. The method according to claim 2, wherein the raw material further contains nickel oxide, and a content of nickel oxide falls within a range from 0.01 mol % to 2.0 mol %.

12. The method according to claim 2, wherein the glass composition substantially contains no multivalent element as a defoaming agent.

13. The method according to claim 12, wherein none of V, Mn, Sn, Ce, Nb and Ta is contained in the glass composition for protecting a semiconductor junction as the multivalent.

14. The method according to claim 2, wherein forming the layer made of the glass composition includes forming the layer made of the glass composition by an electrophoresis method.

15. The method according to claim 14, wherein forming the single-layered oxide film includes forming the single-layered oxide film with a thickness which falls within a range from 5nm to 60nm.

16. The method according to claim 2, wherein
preparing the semiconductor element includes:
preparing a semiconductor base body having a pn junction arranged parallel to a main surface of the semiconductor base body; and
forming a trench from a main surface of the semiconductor base body to expose the pn junction exposure portion on an inner surface of the trench, and
forming the single-layered oxide film includes forming the single-layered oxide film over the inner surface of the trench such that the first portion of the single-layered oxide film covers the pn junction exposure portion.

17. The method according to claim 16, wherein forming the single-layered oxide film includes forming the single-layered oxide film by a thermal oxidation method.

18. The method according to claim 16, wherein forming the single-layered oxide film includes forming the single-layered oxide film by a deposit method.

19. The method of manufacturing a semiconductor device according to claim 2, wherein the first step includes a step of forming the pn junction exposure portion on a surface of a semiconductor base body, the second step includes a step of forming the insulation layer on the surface of the semiconductor base body such that the insulation layer covers the pn junction exposure portion, and the third step includes a step of forming the glass layer on the insulation layer.

20. The method of manufacturing a semiconductor device according to claim 19, wherein the insulation layer is formed by a thermal oxidation method in the second step.

21. The method of manufacturing a semiconductor device according to claim 19, wherein the insulation layer is formed by a deposit method in the second step.

* * * * *